(12) United States Patent
Kim et al.

(10) Patent No.: US 9,331,189 B2
(45) Date of Patent: May 3, 2016

(54) LOW VOLTAGE NANOSCALE VACUUM ELECTRONIC DEVICES

(71) Applicant: UNIVERSITY OF PITTSBURGH—OF THE COMMONWEALTH SYSTEM OF HIGHER EDUCATION, Pittsburgh, PA (US)

(72) Inventors: Hong Koo Kim, Wexford, PA (US); Siwapon Srisonphan, Pittsburgh, PA (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 231 days.

(21) Appl. No.: 13/888,493

(22) Filed: May 7, 2013

(65) Prior Publication Data
US 2013/0299773 A1    Nov. 14, 2013

Related U.S. Application Data

(60) Provisional application No. 61/644,768, filed on May 9, 2012.

(51) Int. Cl.
*H01L 29/92* (2006.01)
*H01L 29/76* (2006.01)
(Continued)

(52) U.S. Cl.
CPC ........ *H01L 29/7613* (2013.01); *H01L 27/1446* (2013.01); *H01L 29/66181* (2013.01); *H01L 29/66439* (2013.01); *H01L 29/94* (2013.01); *H01L 31/06* (2013.01); *H01L 31/062* (2013.01); *H01L 31/08* (2013.01); *H01L 31/113* (2013.01);
(Continued)

(58) Field of Classification Search
CPC  H01L 29/76; H01J 2201/30423; H01J 3/022; H01J 1/3042
See application file for complete search history.

(56) References Cited

U.S. PATENT DOCUMENTS 3,753,022 A * 8/1973 Fraser, Jr. ...................... 313/439
3,755,704 A * 8/1973 Spindt et al. .................. 313/309
(Continued)

OTHER PUBLICATIONS

Jin-Woo Han et al., "Vacuum nanoelectronics: Back to the future?—Gate insulated nanoscale vacuum channel transistor," Appl. Phys. Lett. 100, 213505-1-4, American Institute of Physics (2012).
(Continued)

*Primary Examiner* — Thao X Le
*Assistant Examiner* — J. R. Oakley
(74) *Attorney, Agent, or Firm* — Eckert Seamans Cherin & Mellott, LLC; Philip E. Levy

(57) ABSTRACT

An electronic device including a first conducting layer, a second conducting layer, and an insulating layer provided between the conducting layers. At least one side wall extends from the first conducting layer to the second conducting layer and includes at least a portion of the first conducting layer, the second conducting layer and the insulating layer. A bias voltage is applied between the first and second conducting layers, wherein responsive to the bias voltage, a two dimensional electron system is induced at least in one of the first conducting layer and the second conducting layer, and wherein electrons from the two dimensional electron system are emitted from the side wall side wall as a result of Coulombic repulsion and travel in air from the one of the first conducting layer and the second conducting layer to the other of the first conducting layer and the second conducting layer.

26 Claims, 20 Drawing Sheets

(51) Int. Cl.
*H01L 29/66* (2006.01)
*H01L 29/94* (2006.01)
*H01L 31/06* (2012.01)
*H01L 31/062* (2012.01)
*H01L 31/08* (2006.01)
*H01L 31/113* (2006.01)
*H01L 27/144* (2006.01)
*H01J 3/02* (2006.01)
*H01J 1/304* (2006.01)

(52) U.S. Cl.
CPC ............... *H01J 1/3042* (2013.01); *H01J 3/022* (2013.01); *H01J 2201/30423* (2013.01); *Y02E 10/50* (2013.01)

(56) References Cited

U.S. PATENT DOCUMENTS

| | | | |
|---|---|---|---|
| 4,498,952 A * | 2/1985 | Christensen | 438/20 |
| 5,214,347 A * | 5/1993 | Gray | 313/355 |
| 5,502,348 A * | 3/1996 | Moyer et al. | 313/310 |
| 5,804,909 A * | 9/1998 | Nilsson et al. | 313/309 |
| 6,130,503 A * | 10/2000 | Negishi et al. | 313/495 |
| 6,135,839 A * | 10/2000 | Iwase et al. | 445/24 |
| 6,278,228 B1 * | 8/2001 | Iwase et al. | 313/306 |
| 6,437,360 B1 * | 8/2002 | Cho et al. | 257/10 |
| 6,924,158 B2 * | 8/2005 | Syms | 438/20 |
| 8,115,207 B2 * | 2/2012 | Kim et al. | 257/66 |
| 2005/0162064 A1 * | 7/2005 | DiSanto et al. | 313/495 |
| 2005/0168131 A1 * | 8/2005 | DiSanto et al. | 313/497 |
| 2008/0191189 A1 * | 8/2008 | Kastalsky | 257/10 |
| 2009/0140626 A1 * | 6/2009 | Kim et al. | 313/306 |

OTHER PUBLICATIONS

S. Mil'shtein et al., "Perspectives and limitations of vacuum microtubes," J. Vac. Sci. Technol. A, vol. 11, No. 6, American Vacuum Society, 3126-3129 (1993).

C.A. Spindt, "A Thin-Film Field-Emission Cathode," Communications, Applied Physics Laboratory, Stanford Research Institute, 3504-3505(1968).

M. Feng et al., "Device technologies for RF front-end circuits in next-generation wireless communications," Proceedings of IEEE, vol. 92, No. 2, 354-375 (2004).

L. Liao et al., "High-speed graphene transistors with a self-aligned nanowire gate," Nature 467, 305-308 (2010).

Y. Lin et al., "Wafer-scale graphene integrated circuit," Science 332, 1294-1297 (2011).

* cited by examiner

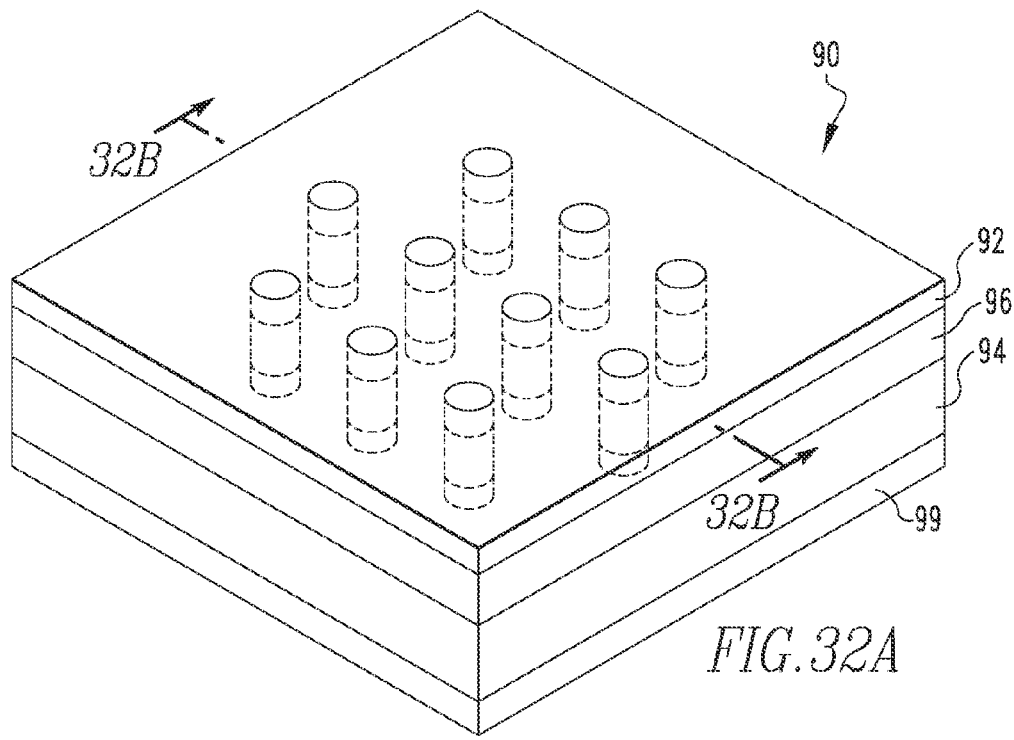
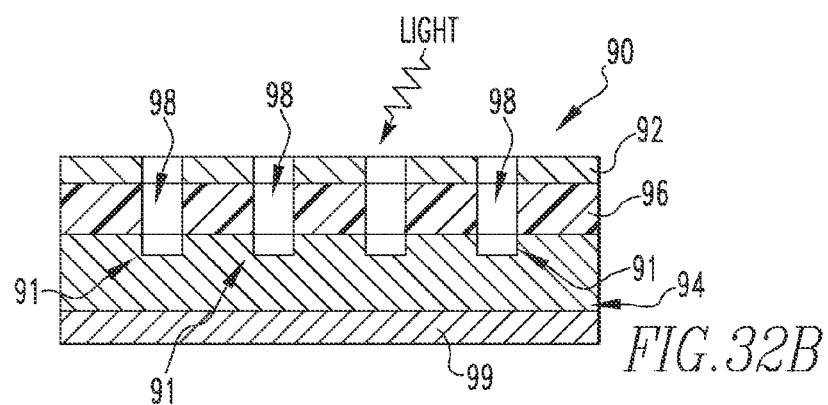
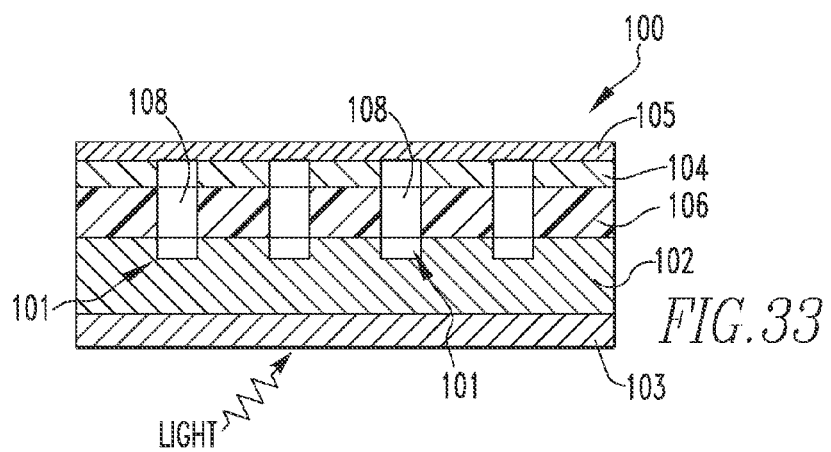

LOW VOLTAGE NANOSCALE VACUUM ELECTRONIC DEVICES

CROSS-REFERENCE TO RELATED APPLICATIONS

This application claims priority under 35 U.S.C. §119(e) from provisional U.S. patent application No. 61/644,768, entitled "Low Voltage Nanoscale Vacuum Electronic Devices" and filed on May 9, 2012, the contents of which are incorporated herein by reference.

GOVERNMENT CONTRACT

This invention was made with government support under NSF Grant # ECCS-0925532 awarded by the National Science Foundation. The government has certain rights in the invention.

BACKGROUND OF THE INVENTION

1. Field of the Invention

The present invention pertains to low voltage, high speed nano-vacuum electronic devices, and, in particular, the device structure wherein Coulombic repulsion in a two-dimensional electron system induced in a cathode of the electronic device is used to enable thresholdless emission of electrons and their subsequent ballistic transport in ambient air.

2. Description of the Related Art

A common requirement in developing high speed electronic devices is to reduce the carrier transport time, and this is usually achieved by decreasing the channel length and/or by increasing the carrier velocity to a ballistic regime. Achieving a ballistic transport of charge carriers in a solid-state medium, however, requires a careful design of materials and structure, because a high electric field applied across a channel often incurs numerous conflicting situations with a requisite scattering-free transport in the medium. Vacuum would serve as an ideal medium for ballistic transport of electrons, but vacuum electronic devices commonly suffer from low emission current and high operating voltage.

Thus, there is a need for an electronic device that offers an ultrafast and high current density operation at low voltage in room-temperature ambient air.

SUMMARY OF THE INVENTION

In one embodiment, an electronic device is provided that includes a first conducting layer, a second conducting layer, and an insulating layer provided between the first conducting layer and the second conducting layer. In addition, the electronic device includes at least one side wall that extends from the first conducting layer to the second conducting layer and that includes at least a portion of each of the first conducting layer, the second conducting layer and the insulating layer. A bias voltage is applied between the first conducting layer and the second conducting layer, wherein responsive to the bias voltage, a two dimensional electron system is induced at least in one of the first conducting layer and the second conducting layer, and wherein electrons from the two dimensional electron system are emitted from the at least one side wall side wall as a result of Coulombic repulsion and travel in air from the one of the first conducting layer and the second conducting layer to the other of the first conducting layer and the second conducting layer.

In another embodiment, a method of operating an electronic device is provided, wherein the electronic device has a first conducting layer, a second conducting layer, an insulating layer provided between the first conducting layer and the second conducting layer, and at least one side wall that extends from the first conducting layer to the second conducting layer and that includes at least a portion of each of the first conducting layer, the second conducting layer and the insulating layer. The method includes providing a bias voltage between the first conducting layer and the second conducting layer to induce a two dimensional electron system at least in one of the first conducting layer and the second conducting layer and thereby cause electrons from the two dimensional electron system to be emitted from the at least one side wall side wall as a result of Coulombic repulsion and travel in air from the one of the first conducting layer and the second conducting layer to the other of the first conducting layer and the second conducting layer.

In still another embodiment, a method of making an electronic device includes providing a structure that includes a first conducting layer, a second conducting layer, and an insulating layer provided between the first conducting layer and the second conducting layer, and providing at least one side wall in the structure that extends from the first conducting layer to the second conducting layer and that includes at least a portion of each of the first conducting layer, the second conducting layer and the insulating layer, wherein the at least one side wall is structured such that responsive to a bias voltage applied between the first conducting layer and the second conducting layer a two dimensional electron system is induced at least in one of the first conducting layer and the second conducting layer and electrons from the two dimensional electron system are emitted from the at least one side wall side wall as a result of Coulombic repulsion and travel in air from the one of the first conducting layer and the second conducting layer to the other of the first conducting layer and the second conducting layer. In another embodiment, a photodetector is provided that includes a transparent first conducting layer, a second conducting layer, and an insulating layer provided between the first conducting layer and the second conducting layer, wherein the photodetector includes a void channel defining at least one side wall that extends from the insulating layer to the second conducting layer and that includes at least a portion of the second conducting layer and the insulating layer.

In still another embodiment, spectral sensing device is provided that includes a transparent first conducting layer including a conductive material having a plurality of apertures provided therein, a second conducting layer, and an insulating layer provided between the first conducting layer and the second conducting layer, wherein the spectral sensing device includes a void channel defining at least one side wall that extends from the insulating layer to the second conducting layer and that includes at least a portion of the second conducting layer and the insulating layer.

In still another embodiment, a photovoltaic cell is provided that includes a transparent first conducting layer, a light absorbing second conducting layer attached to a metal Ohmic contact layer, and an insulating layer provided between the first conducting layer and the second conducting layer, wherein the photovoltaic cell includes a void channel defining at least one side wall that extends from the insulating layer to the second conducting layer and that includes at least a portion of the second conducting layer and the insulating layer.

In still another embodiment, an electron source device is provided that includes a first conducting layer having an aperture provided therein, a second conducting layer, and an insulating layer provided between the first conducting layer and the second conducting layer, wherein the electron source device includes a void channel defining at least one side wall that extends from the insulating layer to the second conducting layer and that includes at least a portion of the second conducting layer and the insulating layer, and wherein the aperture is aligned with and provide over the void channel.

In yet another embodiment, a field emission display device is provided that includes a light emitting layer made of a material that emits light in response to electron excitation, a transparent first conducting layer provided on a first surface of the light emitting layer, a second conducting layer, and an insulating layer provided between the light emitting layer and the second conducting layer, wherein the field emission display device includes a void channel defining at least one side wall that extends from the insulating layer to the second conducting layer and that includes at least a portion of the second conducting layer and the insulating layer.

BRIEF DESCRIPTION OF THE DRAWINGS

FIG. 32A is a schematic illustration and FIG. 32B is a cross-sectional diagram (taken along lines B-B of FIG. 32A) of a photovoltaic cell according to another further embodiment of the present invention;

FIG. 33 is a cross-sectional diagram of a photovoltaic cell according to still a further alternative embodiment of the present invention;

DETAILED DESCRIPTION OF EXEMPLARY EMBODIMENTS

Figure 1:
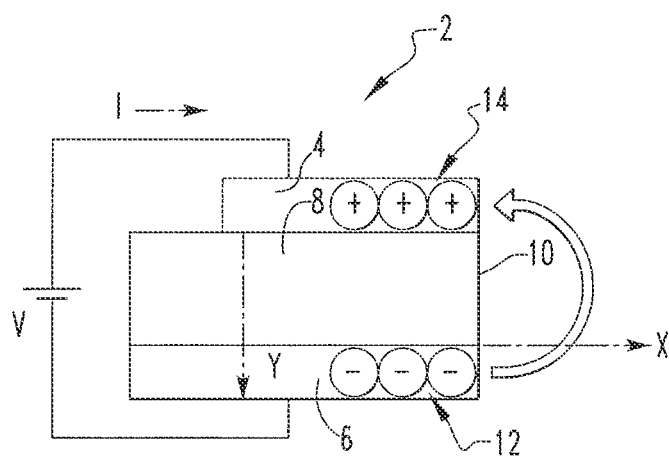
FIGS. 1 and 2 are schematic diagrams of an electronic device according to an exemplary embodiment of the invention.

As used herein, the singular form of "a", "an", and "the" include plural references unless the context clearly dictates otherwise. As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other.

As used herein, the word "unitary" means a component is created as a single piece or unit. That is, a component that includes pieces that are created separately and then coupled together as a unit is not a "unitary" component or body. As employed herein, the statement that two or more parts or components "engage" one another shall mean that the parts exert a force against one another either directly or through one or more intermediate parts or components. As employed herein, the term "number" shall mean one or an integer greater than one (i.e., a plurality).

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

The present invention provides a nanoscale electronic device that offers an ultrafast (e.g., fs transit time) and high current density (e.g., ~$10^5$ A/cm$^2$) operation at low voltage (e.g., ~1 V) in room-temperature ambient air. In particular, and as described in greater detail herein, an electronic device is provided that includes at least one face or side wall that acts as a conduit for ballistic electrons, wherein Coulombic repulsion in a two-dimensional electron system induced in a cathode of the electronic device significantly reduces the barrier height at the edge of the face or side wall, enabling virtually thresholdless emission of electrons.

Figure 2:
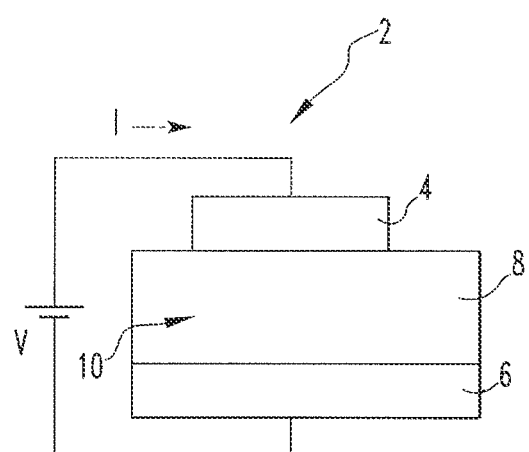

FIG. 1 is a schematic diagram of an electronic device 2 according to an exemplary embodiment of the invention. Electronic device 2 is a capacitor like structure made of a number of stacked layers (each layer may be made of one or more stacked materials as described herein) and having two terminals. As seen in FIG. 1, electronic device 2 includes a first conducting layer 4, a second conducting layer 6 positioned parallel to first conducting layer 4, and an insulating layer 8 provided between first conducting layer 4 and second conducting layer 6. First conducting layer 4 and second conducting layer 6 are each made of a conductive material and act as an electrode. As used herein, the term "conductive material" shall mean a material that can provide mobile charge carriers (electrons or holes) in bulk (3-dimensional) or lower dimensional forms (2-dimensional or 1-dimensional), and may include, without limitation, a metal, such as aluminum, gold, copper, silver, chrome, a semiconductor material, such as silicon, gallium arsenide, an oxide semiconductor, such as indium-tin-oxide, perovskite oxide/heterostructure, a carbon-based conductor material, such as graphene, graphite, or some combination of such materials. Insulating layer 8 is made of an insulating material, such as, without limitation, an air or vacuum gap, a dielectric material like silicon dioxide ($SiO_2$), silicon nitride (SiN) or other wide bandgap oxide or semiconductor material. Electronic device 2 also includes a continuous side wall 10 (also referred to as a side face or side facet) that extends at least from a bottom surface of first conducting layer 4 to a top surface of second conducting layer 6 (in the y direction shown in FIG. 1) and that includes at least a portion of each of first conducting layer 4, second conducting layer 6 and insulating layer 8. A side schematic view of electronic device 2 is shown in FIG. 2 and illustrates side wall 10.

In the illustrated embodiment, first conducting layer 4 acts as an anode and second conducting layer 6 acts as a cathode. In operation, when a small bias voltage (on the order of ~1.0 V) is applied between the anode and the cathode (i.e., between first conducting layer 4 and second conducting layer 6), a two dimensional electron system (2DES), identified by the reference numeral 12, is induced in the second conducting layer 6, and a two dimensional hole system (2DHS) or a layer of positive space charges, identified by the reference numeral 14, is induced in the first conducting layer 4. The anode and cathode electrodes harbor the same amount of charges of opposite polarity for a given bias voltage. As used herein, a 2DES (or 2DHS) shall refer to a system of electrons (or holes) free to move in two dimensions (e.g., the x direction in FIG. 1), but tightly confined in a third dimension (e.g., the y direction in FIG. 1). In response, electrons in 2DES 12 (which acts as a reservoir of electrons) near side wall 10 will experience Coulombic repulsion (in the in-plane lateral direction) from accumulated charges in 2DES 12 and will be emitted from side wall 10. The Coulombic repulsion significantly reduces the barrier height for emission of electrons into air, and thus those electrons will be emitted in a virtually thresholdless manner (negligible barrier height) (here, the thresholdless implies that the minimum required anode-cathode voltage is smaller than ~1.0 V). Those emitted electrons will travel through ambient air (as indicated by the arrow in FIG. 1) from the cathode (second conducting layer 6) to the anode (first conducting layer 4) with a ballistic speed. Electrons approaching the anode edges will experience Coulombic attraction from 2DHS 14 or positive space charge layer formed there, and this will help in capturing electrons into the anode. A current (I) will thus flow from first conducting layer 4 to second conducting layer 6. In one particular, non-limiting exemplary embodiment, the thickness of insulating layer 8 is on the same order as or less than the mean free path of electrons in air (~60 nm). For example, the thickness of insulating layer 8 may be on the order of 20 nm. As a result, very few, if any, of the electrons emitted from side wall 10 will experience collisions, and thus those emitted electrons will travel as if traveling in a vacuum.

Figure 3:
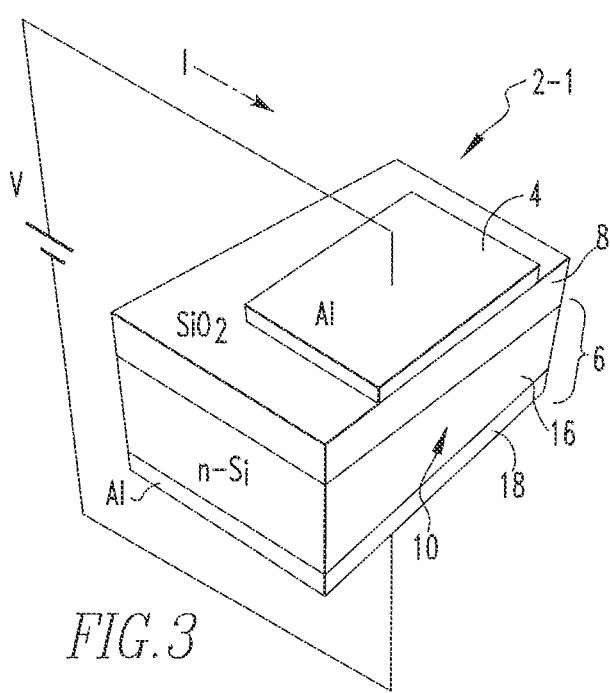
FIG. 3 is an isometric schematic diagram.
Figure 4:
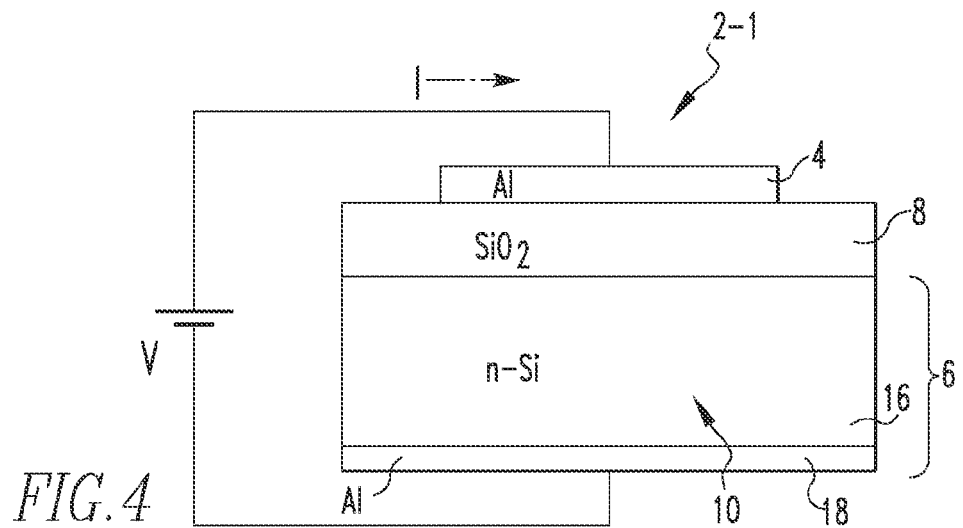
FIG. 4 is a side schematic diagram.
Figure 5:
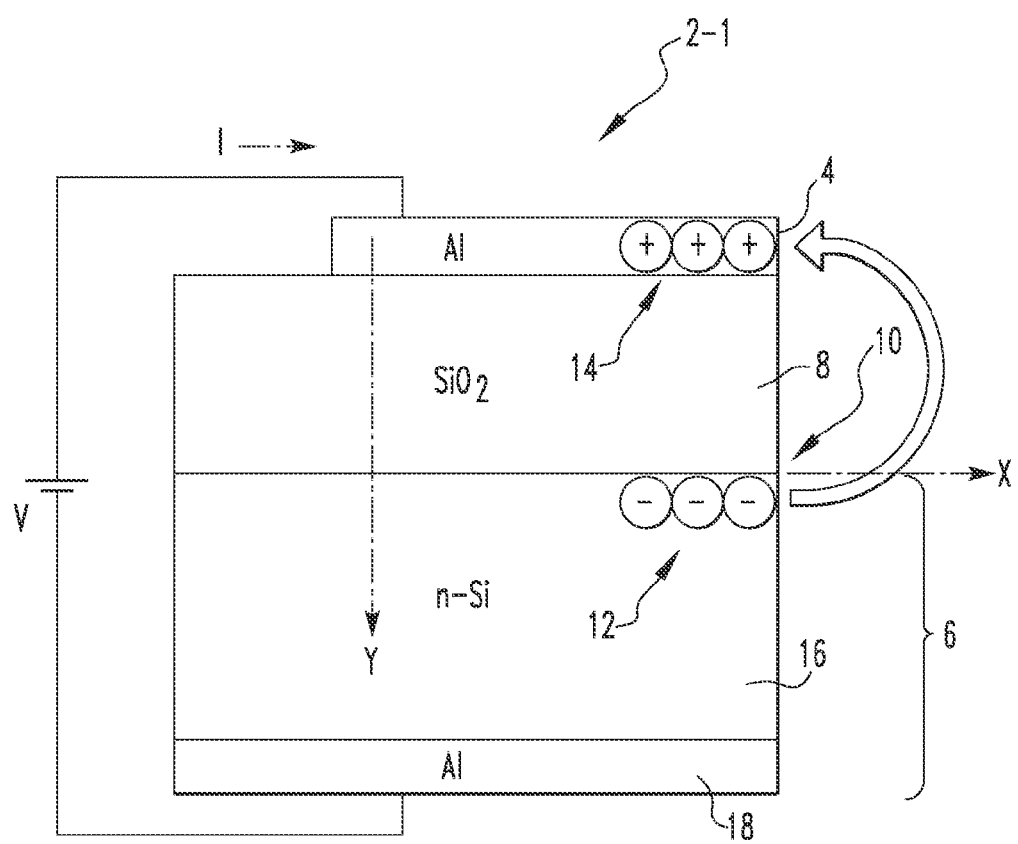
FIG. 5 is a cross-sectional schematic diagram (showing operational characteristics) of an electronic device according to one particular exemplary embodiment of the present invention.

FIG. 3 is an isometric schematic diagram, FIG. 4 is a side schematic diagram, and FIG. 5 is a cross-sectional schematic diagram (showing operational characteristics) of an electronic device 2 (labeled 2-1) according to one particular exemplary embodiment of the present invention. Electronic device 2-1 is a metal-oxide-semiconductor (MOS) capacitor structure wherein first conducting layer 4 is made of aluminum, insulating layer 8 is made of $SiO_2$, and second conducting layer 6 comprises an n-Si substrate 16 coupled to an aluminum electrode 18.

In the exemplary embodiment, electronic device 2-1 is formed by growing an $SiO_2$ (or, alternatively, some other thermal oxide) layer (insulating layer 8) on an n-type Si (e.g., P-doped, 5 Ω-cm resistivity) wafer (n-Si substrate 16). While in the illustrated embodiment, n-Si substrate 16 is employed, it will be understood that, in an alternative embodiment, that substrate may be p-Si, and thus the oxide layer may be grown on a p-type Si (e.g., B-doped, 10 Ω-cm resistivity) wafer. In either case, the wafer may be (100)-oriented; 525 μm thickness. In one particular, non-limiting embodiment, insulating layer 8 made of $SiO_2$ is 23-nm thick. Next, aluminum electrode 18 is formed by depositing an Al layer (e.g., 5N purity) onto the bottom of n-Si substrate 16 by thermal evaporation, followed by Ohmic contact annealing at, for example, 350° C. In one particular, non-limiting embodiment, aluminum electrode 18 is 150-nm-thick. In addition, first conducting layer 4 in the present embodiment is formed by depositing an Al layer (e.g., 5N purity) onto the top of insulating layer 8 by thermal evaporation followed by a photolithography and lift-off process. In one particular, non-limiting embodiment, first conducting layer 4 comprising the aluminum electrode is 20 nm thick, 40-60 μm wide, and 1 mm long.

Next, in the present embodiment, the structure formed as just described is cleaved into two pieces such that each cleaved facet will form a side wall 10, wherein that side wall 10 comprises the cross-sections of first conducting layer 4 (Al), insulating layer 8 ($SiO_2$), and n-Si substrate 16 and aluminum electrode 18 together forming second conducting layer 6 (FIG. 4). As shown in FIG. 5, when a small bias voltage is applied between the anode and the cathode (i.e., between first conducting layer 4 and second conducting layer 6), 2DES 12 is induced in second conducting layer 6 and 2DHS 14 (or a sheet of positive charges) is induced in first conducting layer 4, and, as a result, current (I) is caused to flow from anode to cathode as described in detail elsewhere herein (i.e., due to the emitted electrons traveling through air from cathode to anode).

Figure 6:
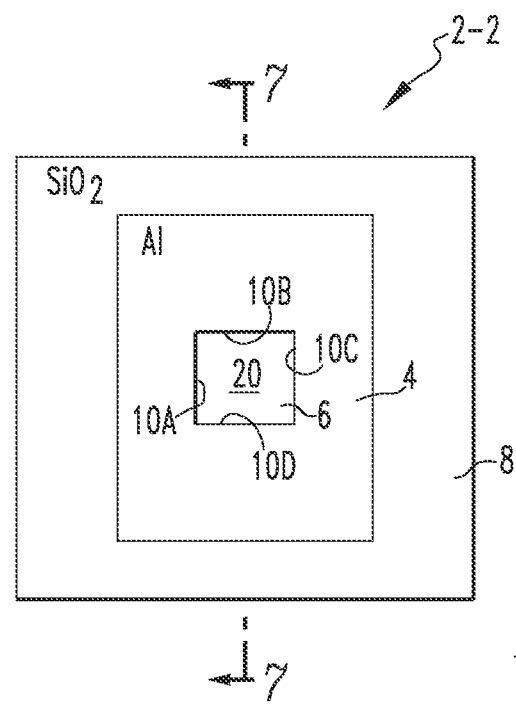
FIG. 6 is a top schematic diagram.
Figure 7:
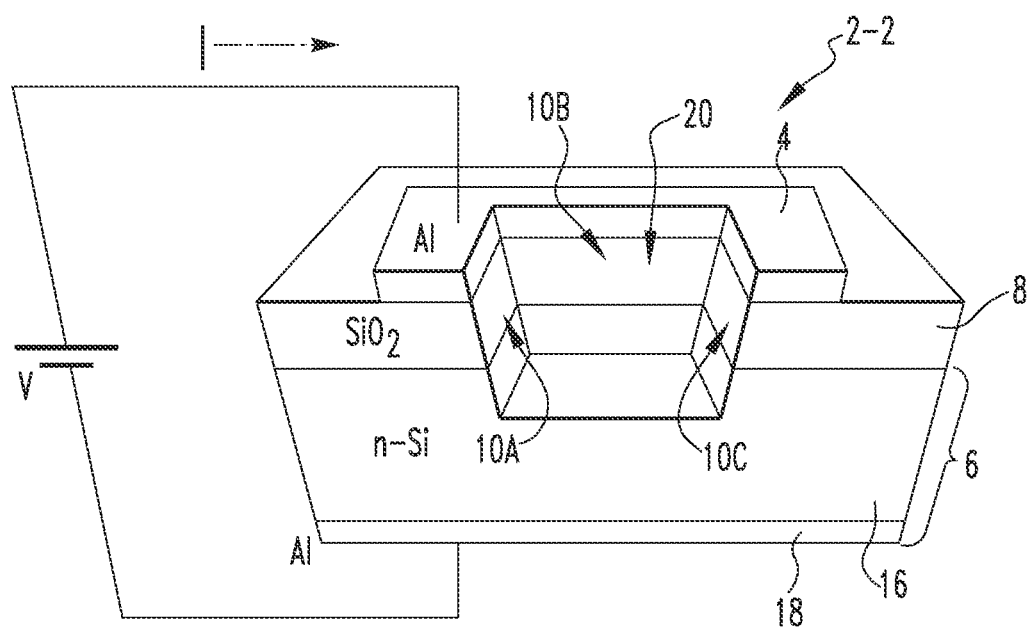
FIG. 7 is an isometric, cross-sectional schematic diagram (taken along lines 7-7 of FIG. 6)
Figure 7A:
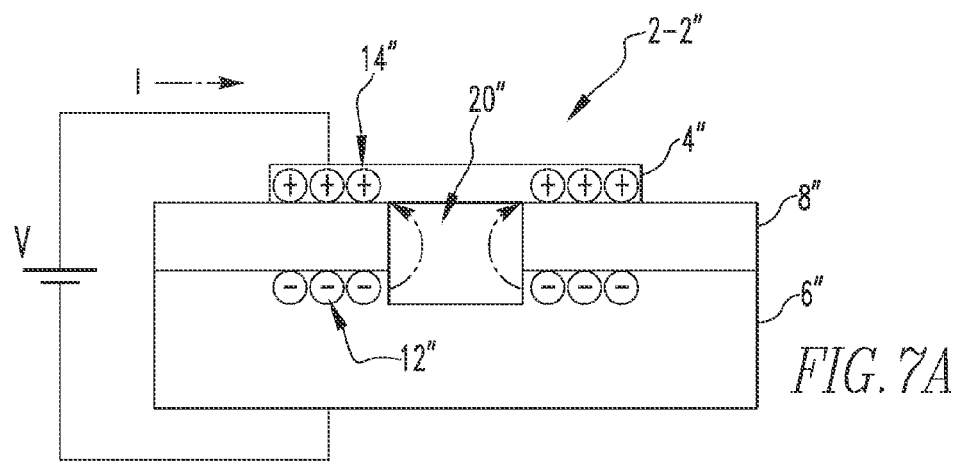
FIGS. 7A-7C are schematic diagrams of an electronic device according to further exemplary embodiments of the invention.
Figure 7B:
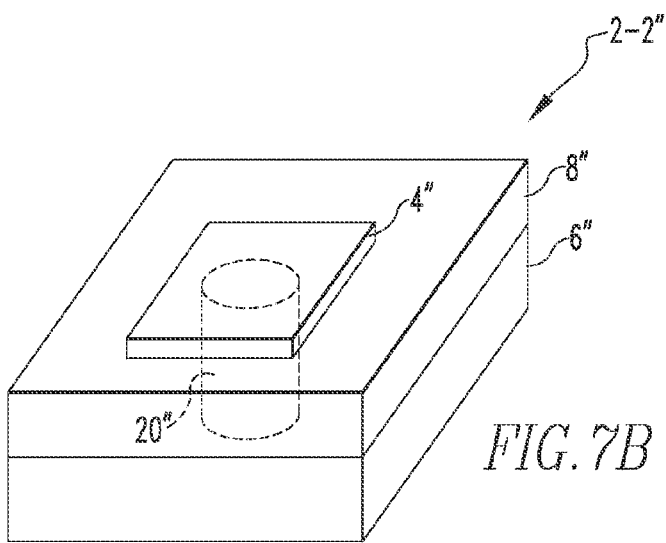
Figure 7C:
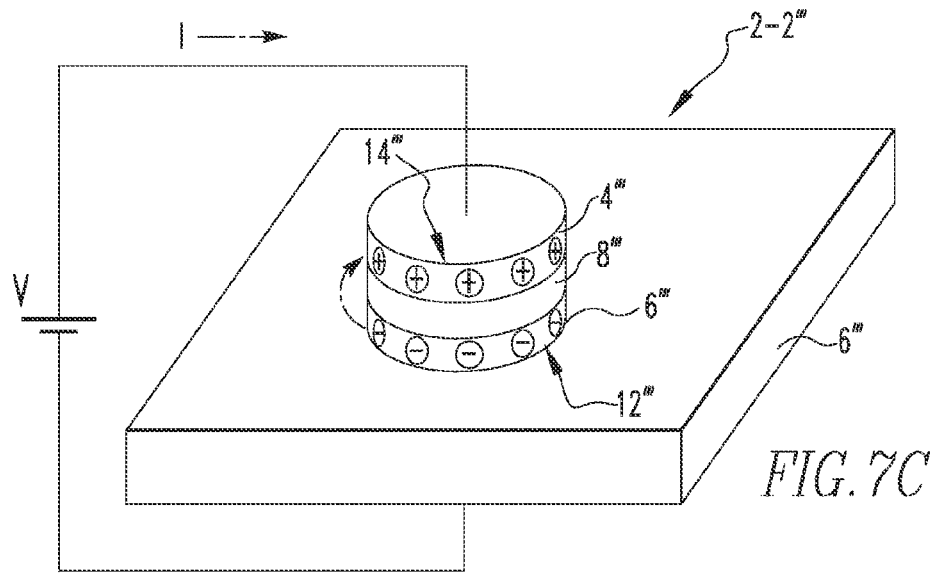
Figure 8:
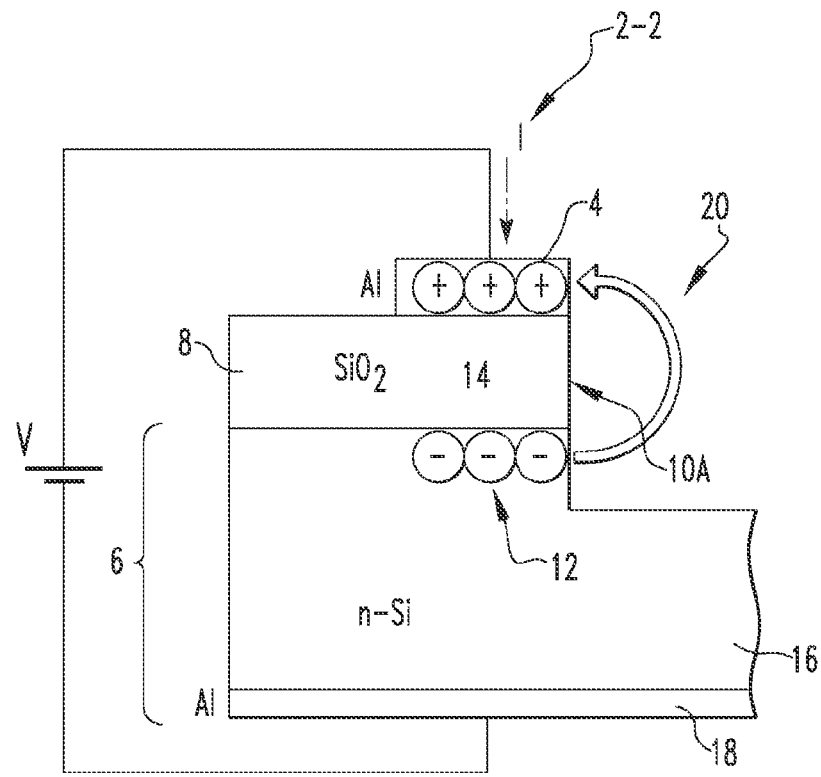
FIG. 8 is a partial cross-sectional schematic diagram (showing operational characteristics) of an electronic device according to another, alternative particular exemplary embodiment of the present invention.

FIG. 6 is a top schematic diagram, FIG. 7 is an isometric, cross-sectional schematic diagram (taken along lines 7-7 of FIG. 6), and FIG. 8 is a partial cross-sectional schematic diagram (showing operational characteristics) of an electronic device 2 (labeled 2-2) according to another, alternative particular exemplary embodiment of the present invention. Electronic device 2-2, like electronic device 2-1 described above, is a metal-oxide-semiconductor (MOS) capacitor structure wherein first conducting layer 4 is made of aluminum, insulating layer 8 is made of $SiO_2$, and second conducting layer 6 comprises an n-Si substrate 16 coupled to an aluminum electrode 18. However, after formation of the basic MOS capacitor structure as described above, rather than cleaving the structure to form side wall 10, the structure is further processed to develop a nanoscale void channel 20 extending from a top surface of first conducting layer 4, through first conducting layer 4 and insulating layer 8, and partially into n-Si substrate 16. The void channel is defined, in minimum, by the insulating layer thickness, and the sidewall extends at least through insulating layer. As seen in FIGS. 6 and 7, void channel 20 in the present embodiment has a rectangular (e.g., square) cross-sectional shape. (forming a number of side walls 10 (four in the present embodiment, labeled 10A, 10B, 10C, 10D). It will be understood that other cross-sectional shapes, such as, without limitation, slit, triangular, round, or oval, for the void channel 20 are also possible. FIGS. 7A and 7B show one such alternative embodiment, labeled electronic device 2-2", wherein the void channel 20" is cylindrical and has a round cross-sectional shape. The sidewalls can also be formed by employing a mesa or pillar structure of various cross-sectional geometries as shown in FIG. 7C, which shows alternative electronic device 2-2'''. In the exemplary embodiment, void channel 20 is formed by employing a focused-ion-beam (FIB)-etching technique using, for example and without limitation, a Seiko Dual Beam System (SMI-3050SE). In one particular embodiment, a Ga ion beam (30 keV; 94 pA) may be used with 0.5-μs dwell time in creating a square void channel 20 (with the following non-limiting example dimensions: cross-section: 0.5×0.5 μm², 1×1 μm², or 2×2 μm; etch depth: 1 μm or 2 μm).

As shown in FIG. 8, when a small bias voltage is applied between the anode and the cathode of electronic device 2-2 (i.e., between first conducting layer 4 and second conducting layer 6), 2DES 12 is induced in second conducting layer 6 and 2DHS 14 is induced in first conducting layer 4. This phenomenon will occur in each of the side walls 10A-10D of void channel 20. As a result, current (I) is caused to flow from anode to cathode as described in detail elsewhere herein (i.e., due to the emitted electrons traveling through air from cathode to anode).

Figure 9:
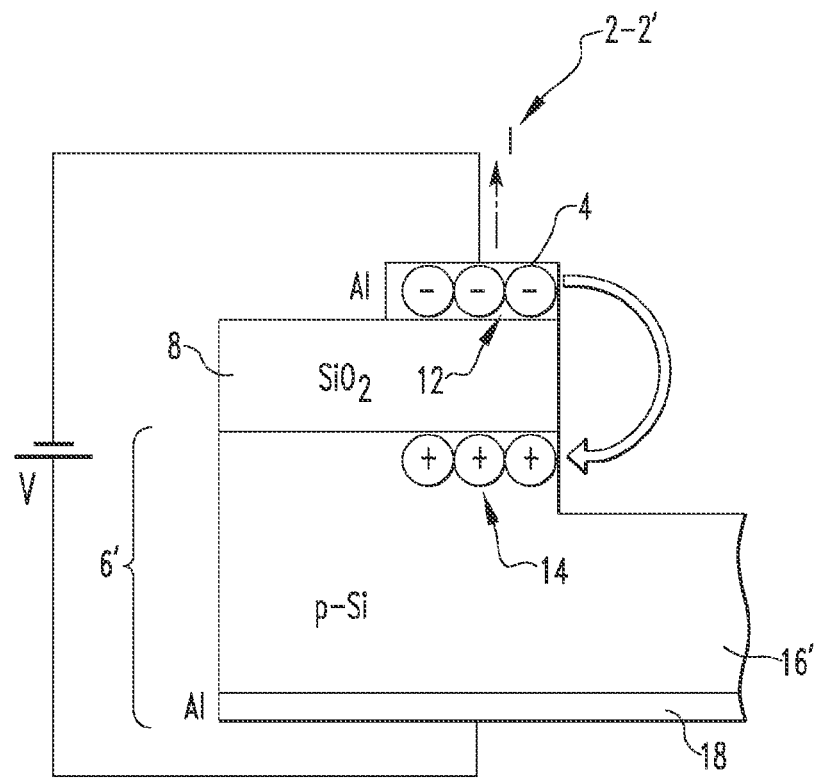
FIG. 9 is a partial cross-sectional schematic diagram (showing operational characteristics) of an according to a further alternative particular exemplary embodiment.

FIG. 9 is a partial cross-sectional schematic diagram (showing operational characteristics) of an electronic device 2-2' according to a further alternative particular exemplary embodiment. Electronic device 2-2' is similar to electronic device 2-2, except that in the basic MOS capacitor structure, p-Si substrate 16' is used instead of n-Si substrate 16 as described elsewhere herein. In this alternative embodiment, first conducting layer 4 will act as the cathode and second conducting layer 6 will act as the anode (as seen in FIG. 9, 2DES 12 is formed in first conducting layer 4 and 2DHS 14 is formed in second conducting layer 6'), with current flowing in the opposite direction.

Figure 10:
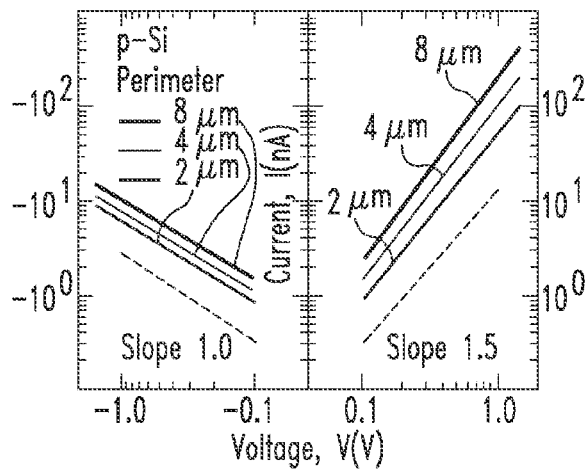
FIGS. 10-13 show the two-terminal I-V characteristics of certain exemplary embodiments of the invention.
Figure 11:
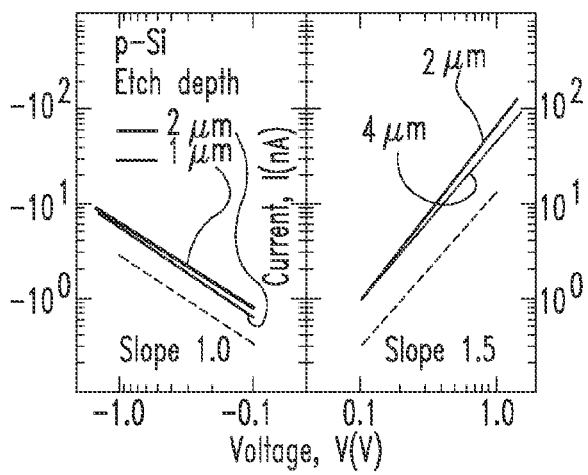
Figure 12:
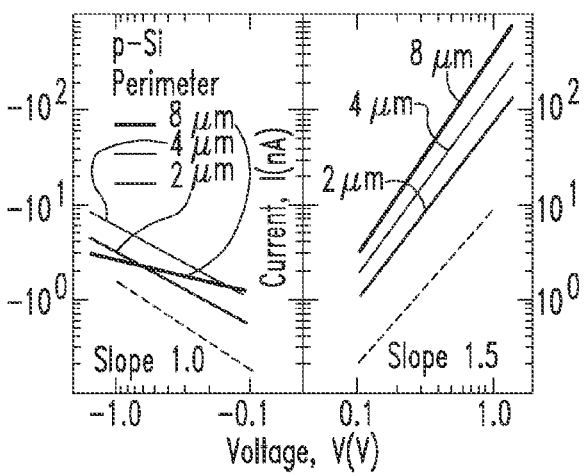

In the exemplary embodiments of electronic device 2-2 and electronic device 2-2' described above, the channel transport properties were characterized by measuring the current-versus-voltage (I-V) characteristics. The two-terminal I-V characteristics, shown in FIGS. 10-12, show a rectifying behavior with a forward slope of ~1.5 and a reverse slope of 0.5-1.0 in the log-log scale plots. In the p-Si (n-MOS) case, the channel reveals a forward characteristic when the Al gate is negatively biased. This implies that electron emission from the metal side is more efficient than from the Si side at the same bias voltage of opposite polarity. With a 0.5×0.5×1.0 μm³ void channel 20 formed on p-Si, for example, a channel current of 43 nA is observed at +1 V bias, whereas 6 nA is obtained at −1 V bias (FIG. 10). Comparison of the three different void channel 20 size samples (perimeter of 2, 4, or 8 μm) reveals that the channel current is proportional to the perimeter of void channel (well) 20, not to the area of void channel (well) 20. This result suggests that electron emission occurs at the edge surface (periphery) on the vertical sidewalls of a void channel (well) 20. Samples with different etch depth (1 or 2 μm) show the same level of current (FIG. 11), a result consistent with the fact that the channel length is effectively determined by the oxide layer thickness. In the n-Si (p-MOS) case, a forward characteristic is observed when the substrate is negatively biased, implying that electron emission from Si is more efficient than the other way, e.g., 60 nA at +1 V versus 3 nA at −1 V for the 0.5×0.5×1.0 μm³ well sample (FIG. 12).

Figure 13:
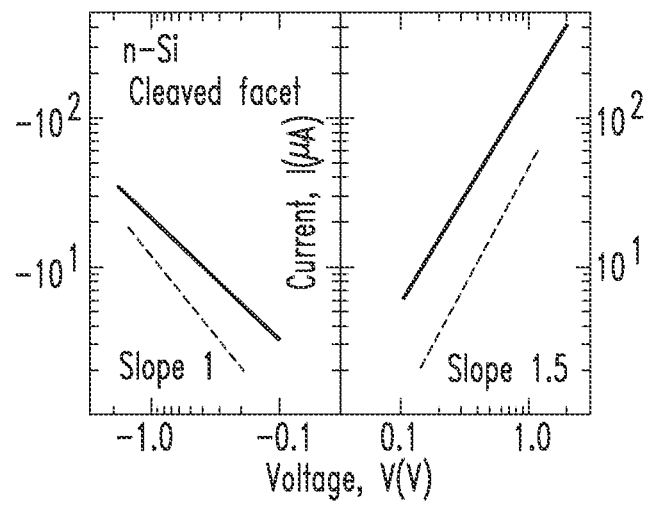

The forward characteristic with a slope of 1.5, that is, the $V^{3/2}$ voltage-dependence corresponds to the Child-Langmuir's space-charge-limited (SCL) current flow in vacuum:

$$J = \frac{4}{9}\varepsilon\sqrt{\frac{2e}{m^*}}\frac{V^{3/2}}{d^2},$$

where $\varepsilon$ is the permittivity of gap medium, $m^*$ is the effective mass of electron, d is the gap size, and V is the applied voltage. This space-charge-limited current flow assumes a scattering-free ballistic transport of electrons across the gap with a negligible barrier height for carrier injection. In order to make sure that the observed $V^{3/2}$ dependence is from the electron transport through the air (nanoscale vacuum), not from a surface conduction that might be enabled by possible etch residue or deposit on the oxide surface, the cleaved embodiment of FIGS. 3-5 (electronic device 2-1) was also tested. It was determined that the cleaved samples clearly demonstrate the same rectifying I-V characteristic (forward slope of 1.5 and reverse slope of ~1) as the FIB samples (FIG. 13). The leakage current through the oxide layer was also characterized by performing I-V measurement prior to FIB etching. The oxide leakage was measured to be ~20 pA at 2 V bias, far smaller than the channel current level described above.

Figure 14:
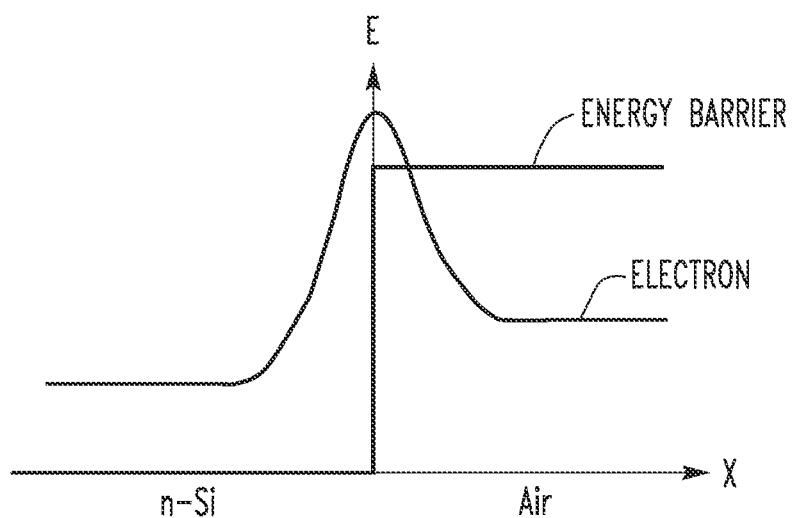
FIG. 14 is a schematic illustration of electron potential and energy barrier profiles of certain exemplary embodiments of the invention.
Figure 15:
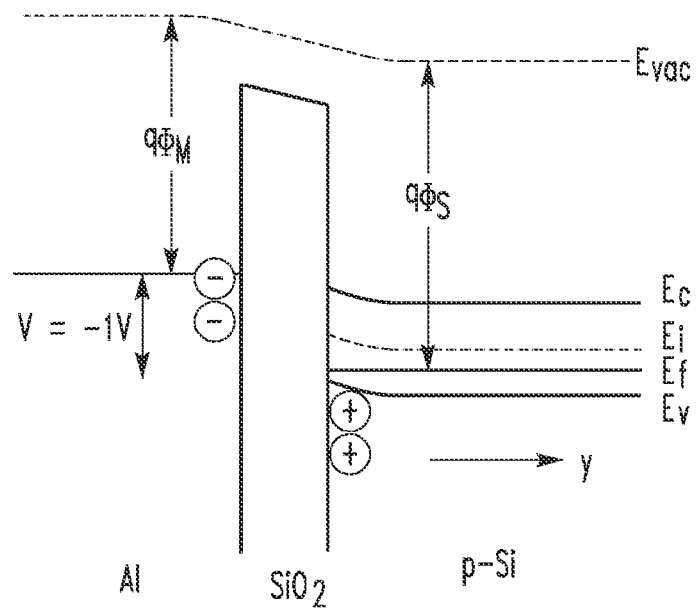
FIG. 15 is an energy band diagram of the p-Si sample of an exemplary embodiment of the invention.

FIG. 14 is a schematic illustration of electron potential and energy barrier profiles on the plane of the 2DES 12 at the Si/SiO₂ interface of electronic devices 2-2 and 2-2'. FIG. 15 is an energy band diagram of the p-Si sample (electronic device 2-2') at 1 V forward bias, and FIG. 16 is an energy band diagram of the n-Si sample (electronic device 2-2) at 1 V forward bias.

Figure 16:
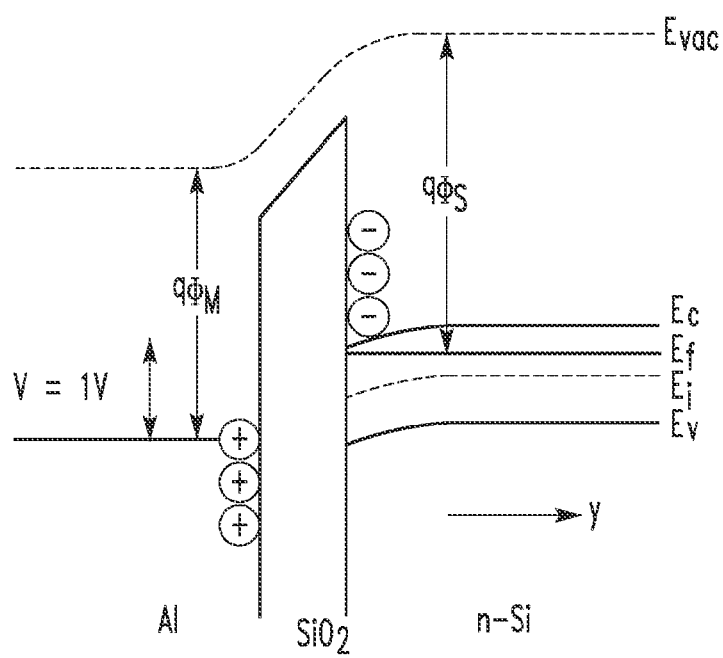
FIG. 16 is an energy band diagram of the n-Si sample of an exemplary embodiment of the invention.

In the n-Si case, the flat band voltage is −0.32 V, and the MOS is accumulation biased by the amount of 1.32 V (FIG. 16). The electron accumulation in Si is estimated to be $1 \times 10^{12}$ cm$^{-2}$ at this bias voltage, and the same amount of charges of opposite polarity are expected to be induced in the metal side across the oxide layer. As described elsewhere herein, the accumulation electrons form a 2DES 12, and this layer serves as a reservoir of electrons that would be readily available for emission through the edge under forward bias. From the charge neutrality point of view, approximately 74% of the total accumulation electrons in Si are balanced by adjacent polarization charges induced at the Si/SiO₂ interface. This implies the "net" accumulation electrons that are balanced by "remote" charges across the oxide layer account for 26% of total accumulation, which corresponds to the ratio, $\varepsilon_0/\varepsilon_{SiO_2}$. The mean spacing of electrons in this "net" charged 2DES is given as $2(\pi n)^{-1/2}$, and is estimated to be ~20 nm, comparable to the separation of 2D systems of opposite charges, that is, the oxide layer thickness (23 nm). The Coulomb potential around the edge is then expected to be significantly altered, enabling, as described elsewhere herein, virtually barrierless emission of electrons into air, thereby the Child-Langmuir's space-charge-limited current flow in the void channel 20.

In the p-Si case, the flat band voltage is −0.90 V, and the MOS at I-V forward bias is accumulation biased by the amount of 0.10 V (FIG. 15). The hole accumulation in Si is estimated to be $5 \times 10^{10}$ cm$^{-2}$, and the same amount of electrons are induced in the metal side. 26% of the accumulation electrons are balanced by remote holes, and the mean spacing of electrons in the net charged 2DES is estimated to be ~100 nm. This 2DES in metal serves as a reservoir of electrons for emission under forward bias. Field penetration into metal is less than that in Si, and the 2DES in metal is more narrowly confined (<1 nm) than that in Si (2-3 nm). Electrons are injected into air from the cathode (Al) edges with negligible barrier height. The overall voltage dependence of anode current is then governed by the channel transport properties, which demonstrates the Child-Langmuir's $V^{3/2}$ dependence (FIGS. 10 and 11). In reverse bias, part of the bias voltage goes to depletion region formation in Si, therefore void-channel 20 receives less voltage than the accumulation case. This explains the reduced slope (0.5-1.0) in reverse bias. In the n-Si case, the forward bias (slope of 1.5) corresponds to the case of electron emission from the accumulation layer formed in Si, and the top metal gate serves as an anode. In reverse bias, part of the voltage goes to the depletion region in Si, and the I-V characteristic demonstrates a reduced slope (0.5-1.0), similar to the p-Si case (FIG. 12).

Furthermore, in structure described in connection with FIGS. 1-9, and as described in detail elsewhere herein, electrons emitted from the cathode edges are expected to travel along side wall 10 and arrive at the open-ended anode with a ballistic speed. Considering this channel/electrode configuration and geometry, all electrons emitted from the cathode might not be collected by the anode, and the measured current may represent a small fraction of total emission. In order to estimate the collection efficiency, the total electron emission from the cathode was measured for an embodiment of electronic device 2-2 (n-Si sample) having a 0.5 μm×0.5 μm×1 μm void channel 20. The channel aperture (first conducting layer 4 with a square opening) was covered with a Ga droplet electrode so that all emitted electrons would be captured without loss (the work function of Ga is 4.3 eV, close to Al's 4.1 eV). The thus-measured channel current was found to be two orders of magnitude greater than that without a cover (i.e., 12 μA versus 60 nA at +1 V forward bias). This implies that ~0.5% of emitted electrons are collected at the anode in open-aperture configuration, or stated equivalently, that the total emission current is 12 μA at +1 V bias. From the Child-Langmuir formula, the total emission area on the cathode (Si) surface is then calculated to be $3 \times 10^{-3}$ μm$^2$. The effective area of electron emission on Si sidewalls is then estimated to be only 1.5 nm thick along the 2 μm periphery. This estimated thickness corresponds well to the spatial confinement of a 2DES induced at the Si/SiO$_2$ interface under inversion or accumulation bias. The electron emission from the Al cathode layer (first conducting layer 4) of a p-Si sample (electronic device 2-2' of FIG. 9) demonstrates a similar level of channel current (40 nA for p-Si versus 60 nA for n-Si at 1-V bias). This suggests that the effective emission area on metal sidewall is also in a similar range (~1 nm (thickness)×2 μm (perimeter)), and this estimate is also in reasonable agreement with the level of confinement of electrons induced at a metal/oxide interface. Overall this supports the notion that the emission current density at the cathode edge can reach ~$10^5$ A/cm$^2$ level at low bias voltage (~1 V) as predicted by the Child-Langmuir model. The channel current density observed in this work is many orders of magnitude greater than those of conventional emission models.

Moreover, the electron flow through a metal-nanogap structure usually involves a two-step process: field emission from the metal surface, commonly described by the Fowler-Nordheim (FN) theory, and subsequent transport through the gap, governed by the Child-Langmuir's space-charge-limited current flow. The Child-Langmuir law assumes zero field (normal component) at cathode surface, whereas the FN emission requires a surface normal field of significant strength (typically ~10 V/nm order for metals with work function of 4-5 eV) in order to enable tunneling emission through the potential barrier at cathode. As more electrons are injected into the gap, the space charge field builds up, reducing the field on the cathode surface, thereby decreasing the Fowler-Nordheim emission. The overall current flow at steady state is then a balancing act of the two processes, usually being governed by the field emission in a low voltage range and by the space charge effect at higher voltages. In the present invention, the SCL regime begins to appear at very low voltage (~0.5 V), whereas the FN regime is absent in the voltage range tested (<2 V). This observation is consistent with the conclusion that, in the present invention, the barrier height for electrons at the cathode edges is very low. As described elsewhere herein, in the 2DES with net accumulation charges, electron emission from the cathode edges is virtually thresholdless, enabling very low voltage operation (similar to the negative electron affinity effect) of channel transport with high current density. Similarly, electrons approaching the anode edges will experience Coulombic attraction from the 2DHS or positive space charge layer formed there, and this will help capturing electrons into the anode.

In the Child-Langmuir SCL transport model, electrons traveling in a gap have the velocity and density distributions expressed as $v(z)=(2\ eV/m)(z/d)^{2/3}$ and $\rho(z)=J/v(z)=(4/9)(\epsilon_0 V/d^2)(z/d)^{-2/3}$, respectively. For channel length d of 23 nm and bias voltage V of 1 V, for example, electrons arrive at the anode surface with $6 \times 10^7$ cm/s velocity, and the electron transit time $3d(2\ eV/m)^{-1/2}$ is calculated to be 120 fs. The total number of electrons being present in the channel is calculated to be $(A/e)\int_0^d \rho(z)dz=(4/3)\epsilon_0 VA/d$~7, where A is the channel area defined as the effective emission area on cathode, and A=2 μm×1 nm is assumed. This suggests single electron level ballistic transport is feasible with the structure shown in FIGS. 1-9 when the channel area is reduced and/or at lower voltage or longer channel length.

Figure 17:
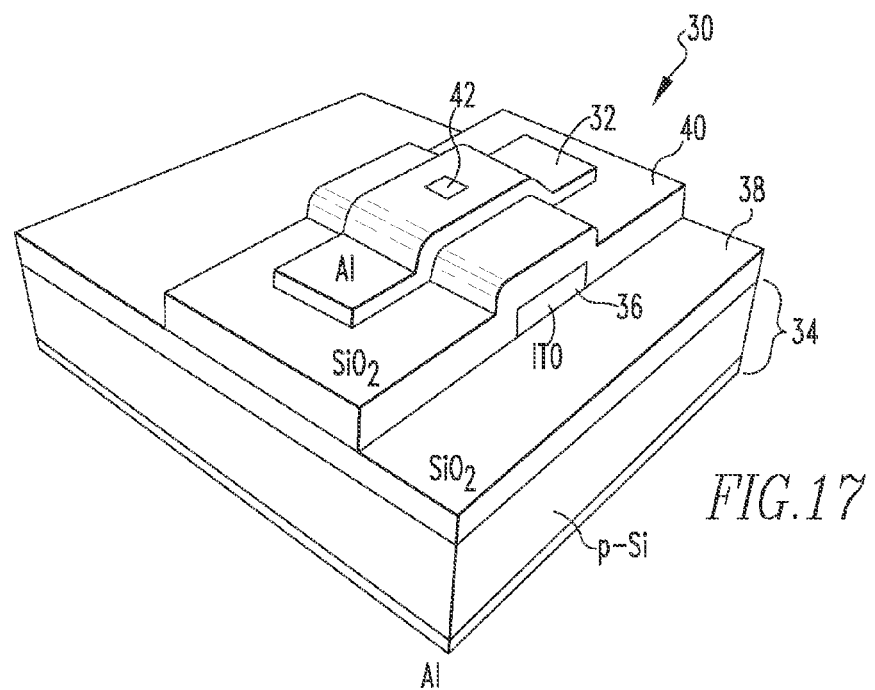
FIG. 17 is an isometric schematic diagram.
Figure 18:
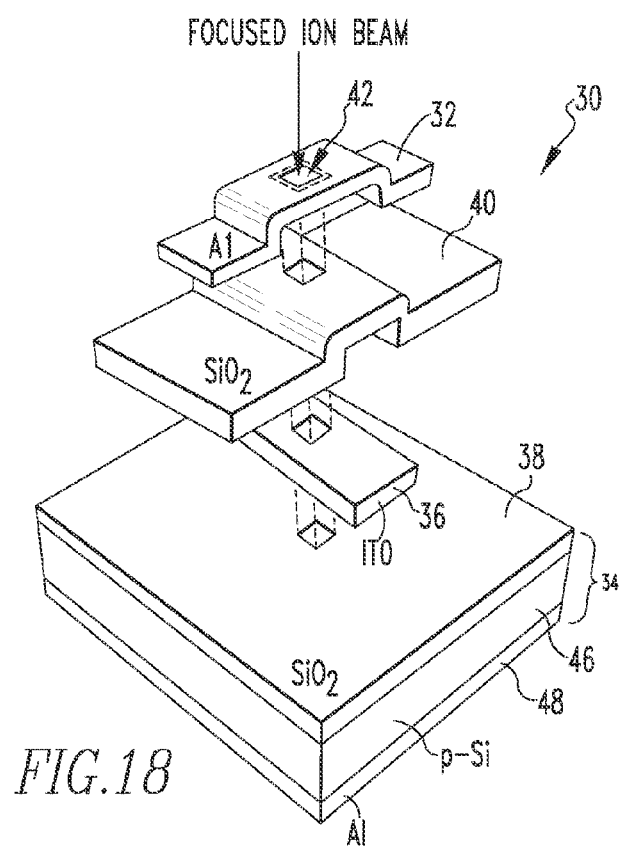
FIG. 18 is an exploded view.
Figure 19:
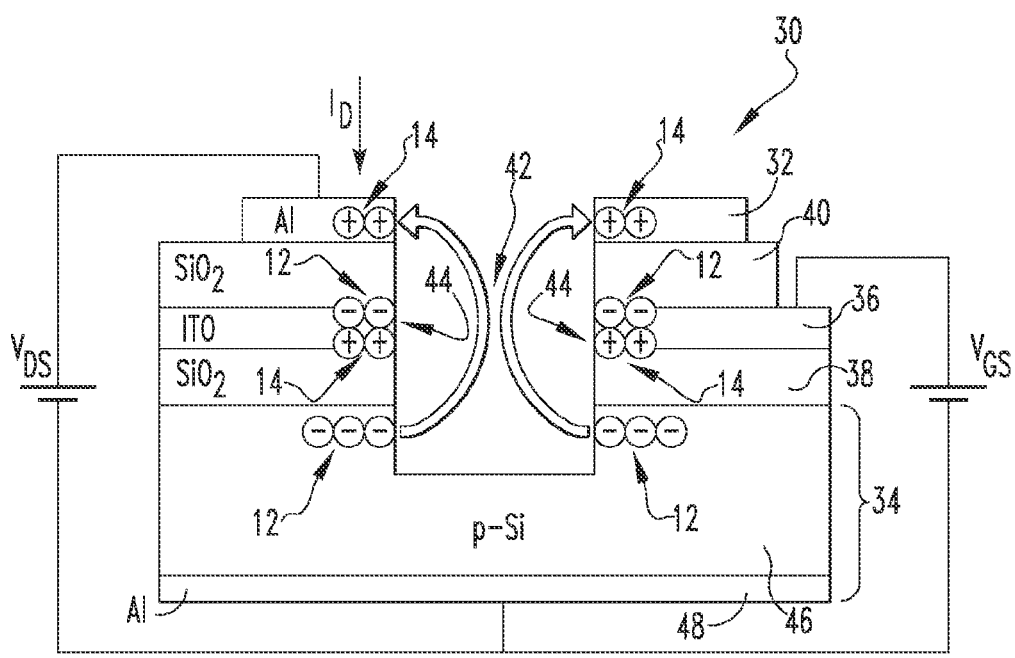
FIG. 19 is a partial cross-sectional view of a field effect transistor (FET) according to a further embodiment of the present invention.

FIG. 17 is an isometric schematic diagram, FIG. 18 is an exploded view and FIG. 19 is a partial cross-sectional view of a field effect transistor (FET) 30 according to a further embodiment of the present invention. As described in detail herein, FET 30 employs the principles of induction of a number of 2DESs and 2DHSs via one or more bias voltages, Coulombic repulsion and resulting ballistic travel of electrons in air that are described elsewhere herein in connection with FIGS. 1-9. As seen in FIGS. 17-19, FET 30 is a stacked, five layer structure. In particular, FET 30 includes a first conducting layer 32, a second conducting layer 34, a third conducting layer 36, a first insulating layer 38 provided between second conducting layer 34 and third conducting layer 36, and a second insulating layer 40 provided between third conducting layer 36 and first conducting layer 32. First conducting layer 32, second conducting layer 34 and third conducting layer 36 are each made of a conductive material and act as an electrode, and insulating layers 38 and 40 are each made of an insulating material.

In addition, FET 30 includes a nanoscale void channel 42 extending from a top surface of first conducting layer 32, through first conducting layer 32, second insulating layer 40, third conducting layer 36, first insulating layer 38, and partially into second conducting layer 34. As seen in FIGS. 17 and 18, void channel 42 in the illustrated embodiment has a rectangular (e.g., square) cross-sectional shape (although other cross-sectional shapes, such as, without limitation, slit, triangular, round, or oval, are also possible) forming a number of side walls 44 (four in the present embodiment). As discussed elsewhere herein (FIG. 7C), the sidewalls can also be formed by employing a mesa or pillar structure of various cross-sectional geometries. In the exemplary embodiment, void channel 42 is formed by employing a focused-ion-beam (FIB)-etching technique. In one particular embodiment, a square void channel 42 may be provided with the following non-limiting example dimensions: cross-section: $0.5 \times 0.5$ $\mu m^2$, $1 \times 1$ $\mu m^2$, or $2 \times 2$ $\mu m^2$; etch depth: 1 $\mu m$ or 2 $\mu m$.

In the non-limiting exemplary embodiment shown in FIGS. 17-19, used herein for illustrating the present invention, first conducting layer 32 is made of aluminum, second conducting layer 34 comprises a p-Si substrate 46 coupled to an aluminum electrode 48, insulating layers 38 and 40 are made of $SiO_2$, and third conducting layer 36 is made of indium-tin oxide (ITO). In the non-limiting, exemplary embodiment, FET 30 is formed in the following manner. First $SiO_2$ first insulating layer 38 is grown on p-Si substrate 46 (e.g., B-doped, 10 $\Omega$-cm resistivity; (100)-oriented; 525 $\mu m$ thickness) by thermal oxidation. In one particular, non-limiting embodiment $SiO_2$ first insulating layer 38 is 23-nm-thick. Next, aluminum electrode 48 is formed by Ohmic contact metallization (e.g., 150-nm-thick Al) on the bottom side of p-Si substrate 46. Then, an ITO layer (e.g., a 20-nm-thick) is deposited on top of $SiO_2$ first insulating layer 38 (on the front side) by radio frequency (RF) magnetron sputtering of an ITO target (e.g., $In_2O_3/SnO_2$, 90/10 wt %; 4N purity;) in Ar ambient gas without intentional heating of the substrate. Subsequently, a stripe pattern (e.g., 40-60 $\mu m$ width; 2-3 mm length) of ITO is developed by performing photolithography and chemical etching (e.g., 1 HCl+5 $H_2O$) to form ITO third conducting layer 36 (an ITO electrode) as shown in FIGS. 17 and 18. Next, $SiO_2$ second conducting layer 40 (e.g., 30-nm-thick) is blanket deposited on top of ITO third conducting layer 36 by RF sputtering of an $SiO_2$ target in Ar ambient without substrate heating. Then, on top of the sputter-deposited $SiO_2$ second conducting layer 40, Al first conducting layer 32 (i.e, a top electrode) (e.g, 20-nm-thick, 60 $\mu m$ width, 1 mm length) is deposited by thermal evaporation and a lift-off process. As seen in FIGS. 17 and 18, Al first conducting layer 32 has a stripe shape that is aligned perpendicular to the ITO third conducting layer 36 also having a stripe shape. Overall, in the exemplary embodiment, the vertically-stacked layer structure at the cross as just described is comprised of: 20-nm Al/30-nm $SiO_2$/20-nm ITO/23-nm $SiO_2$/p-Si substrate/20-nm Al. Finally, a void-channel 42 is formed in the cross area by performing FIB etching (e.g., Ga ion beam: 30 keV; 94 pA; 0.5-$\mu s$ dwell time) of a square well. In the exemplary embodiment, the square well was etched to 2 $\mu m$ depth.

In the present embodiment, ITO third conducting layer 46 serves as a gate electrode of FET 30. In addition, second conducting layer 34 (p-Si substrate 46 coupled to aluminum electrode 48) serves as a source (cathode) electrode and the top Al electrode as a drain (anode) electrode. The channel length of FET 30 is determined by the spacing between first conducting layer 32 (anode) and second conducting layer 34 (i.e, p-Si substrate) (cathode), which is 73 nm in one particular, non-limiting exemplary embodiment.

Figure 20:
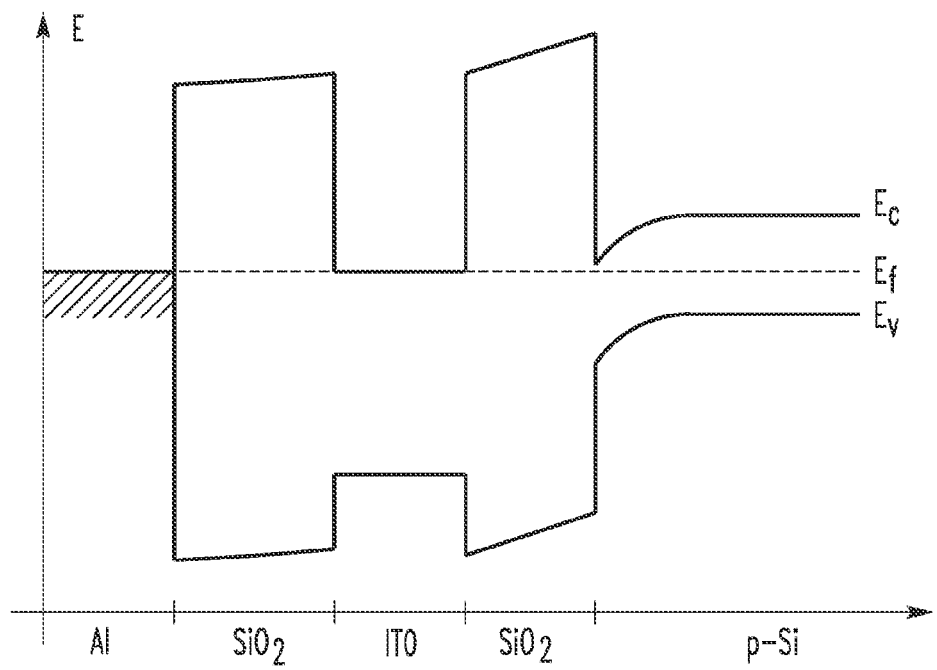
FIG. 20 demonstrates band bending development of an inversion layer in the device of FIGS. 17-19.

Thus, as will be appreciated, in this embodiment, the ITO third conducting layer 36 was introduced into the basic MOS capacitor structure described elsewhere herein (FIGS. 6-9) as a gate electrode/layer. ITO third conducting layer 36 is designed to control formation of an electron inversion layer in p-Si substrate 34. A band bending occurs at zero bias, and an inversion layer readily develops in p-Si even at low gate voltage as shown in FIG. 20. In ITO third conducting layer 36, no significant band bending occurs that can help capture of electrons into the gate layer. In conventional field-effect transistors, the gate voltage controls the transport process by modulating the channel conductance. Similarly, in vacuum tubes, the grid voltage modulates the electron transport to anode. By contrast, the FET 30 directly modulates electron emission by use of an ITO gate in the MOS capacitor structure as described above. With use of an electron inversion layer induced in the cathode (p-Si) as an emission source, a normally OFF mode of operation (i.e., enhancement mode FET) is possible.

Figure 21:
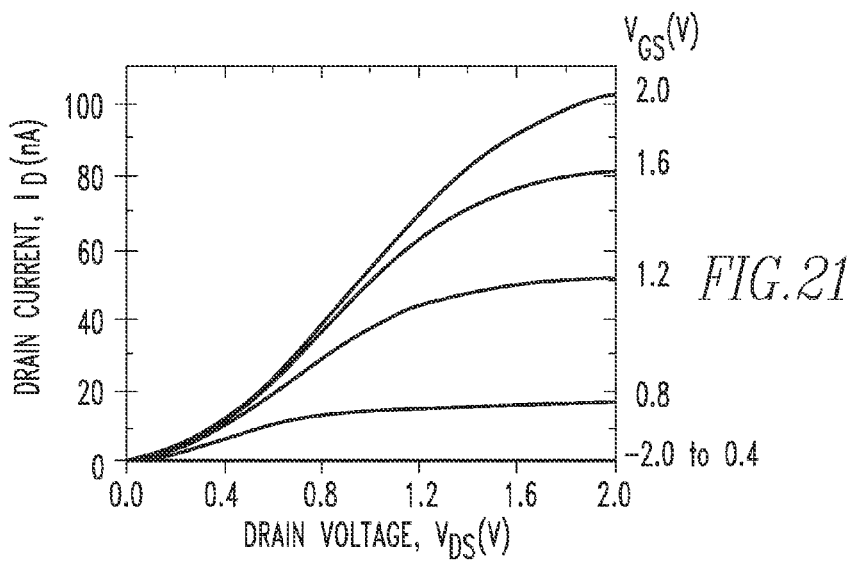
FIGS. 21-23 show the three-terminal I-V characteristics of the device of FIGS. 17-19.
Figure 22:
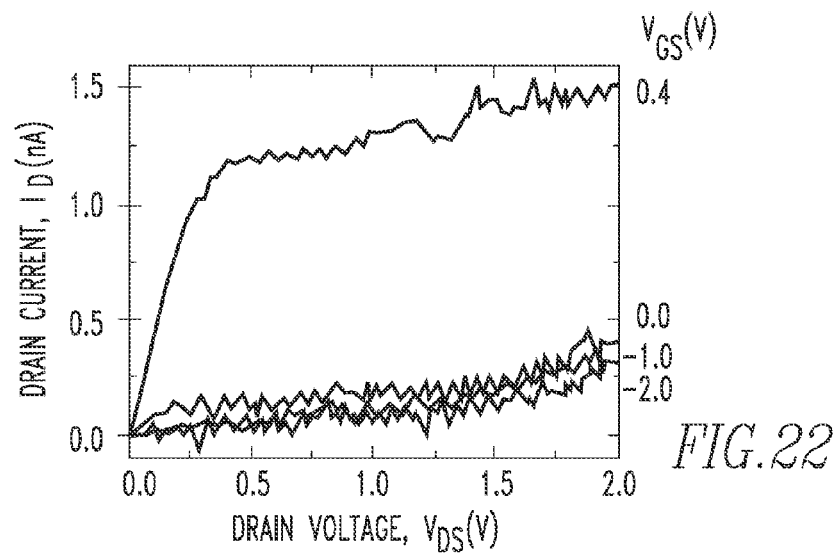
Figure 23:
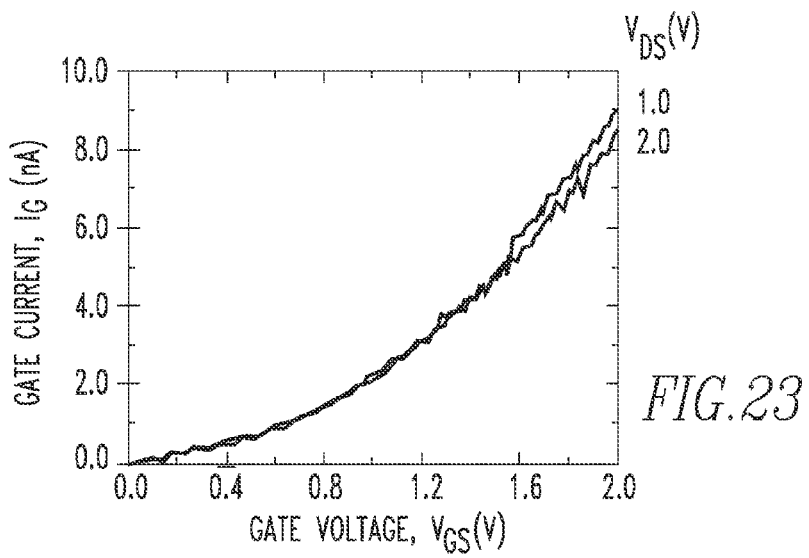

The exemplary embodiment of FET 30 described above was tested with second conducting layer 34 (p-Si substrate 46 coupled to aluminum electrode 48) as cathode (source), first conducting layer 32 (Al electrode) as anode (drain), and ITO third conducting layer 36 as gate (FIG. 19). The three-terminal I-V curves, shown in FIGS. 21-23, measured in the common cathode mode reveal a clear, well-defined field-effect transistor characteristic. FET 30 also demonstrates a turn-on threshold voltage of ~0.5 V. At below threshold ($V_{GS}$<0.5 V), the channel current remains off even at $V_{DS}$ of ~2 V, indicating that the 2DES 12 induced in ITO third conducting layer 36 provides a good shielding effect on the electrostatic field applied by the drain-source voltage. At above threshold ($V_{GS}$>0.5 V), the channel current turns on and reveals $V^{3/2}$ dependence on the drain-source voltage for $V_{DS}$<$V_{GS}$. This indicates that electrons emitted from the inversion layer in p-Si substrate 46 are accelerated by the electric field developed between anode and cathode edges, and travel ballistically in void channel 42. The slope of 1.5 also indicates that the channel current is space-charge limited. As $V_{DS}$ approaches $V_{GS}$, the increase of channel current gradually tapers down. For $V_{DS}$>$V_{GS}$, the channel current remains flat, whose level is solely determined by $V_{GS}$. Overall the channel current is governed by two control parameters: gate voltage ($V_{GS}$), that sets the maximum level of electron inversion charge density in the cathode, and anode voltage ($V_{DS}$), that drives electrons in void channel 42 with a given level of electron supply available at the cathode.

At positive bias on the gate comparable to the anode (for example, $V_{GS}$=2 V and $V_{DS}$=2 V), the gate current ($I_G$) is measured to be ~8 nA (See the figure panel below, f). This corresponds to 8% of the anode current measured at the same bias ($I_D$=100 nA at $V_{GS}$=2 V and $V_{DS}$=2 V) (panel d). This indicates that the gate electrode (ITO) is not as efficient as the anode (Al) in capturing electrons, while it is evident that the gate layer provides a good control of electron emission at cathode edge via modulating induction/depletion of a 2DES layer at the Si/$SiO_2$ interface. This apparently conflicting behavior may suggest that the electron flow is very close to the gate and/or there is no lateral (horizontal) field of sufficient strength that can attract passing electrons into the gate.

Moreover, in the exemplary embodiment of FET 30 described above, the transconductance $g_m$ of FET 30 was measured to be 20 nS/$\mu m$ without correction for anode collection efficiency. When the anode electrode is designed to capture all emitted/transported electrons, the device transconductance is expected to increase by two orders of magnitude, reaching ~2 µS/µm level. This number is comparable to those of FETs made on graphene layers. One way to further increase transconductance would be to increase the total edge length on a given foot print of device, e.g., designing the edges into serpentine or interdigitated patterns. FET 30 also shows an on/off-current ratio of ~500 at $V_{DS}$=2 V, whereas graphene FETs typically produce much smaller ratios (typically ~2). The ballistic SCL regime observed FET 30 extends down to ~0.1 V.

In high frequency operation, the switching speed is expected to be governed by the effective delay time of anode current, expressed as $\tau = C/g_m^{-1}$. In the vertical void-channel FET structure, the device capacitance (C) would scale with gate electrode area (A). The device transconductance ($g_m$) scales with edge length (L): for the case of 100% anode collection efficiency and 23 nm oxide thickness for both gate-cathode and gate-anode capacitors, $g_m$ is expected to reach the level of 2 (µS/µm)×L (µm). For an ideal case, edge length L is to be maximized for minimum electrode area A. An array of closely-spaced slit-shaped aperture wells (instead of having a single square well) would be considered close to ideal. Imagine, for example, a FET with a 1×1 µm² top electrode that fully covers an array of 10 slit wells (100 nm width; 1 µm length; 100 nm slit spacing; 1 µm etch depth) formed within the electrode area: $g_m$ is estimated to be 20 µS, and C is to be 15 fF. This would result in $\tau$ of 80 ps.

Figure 24:
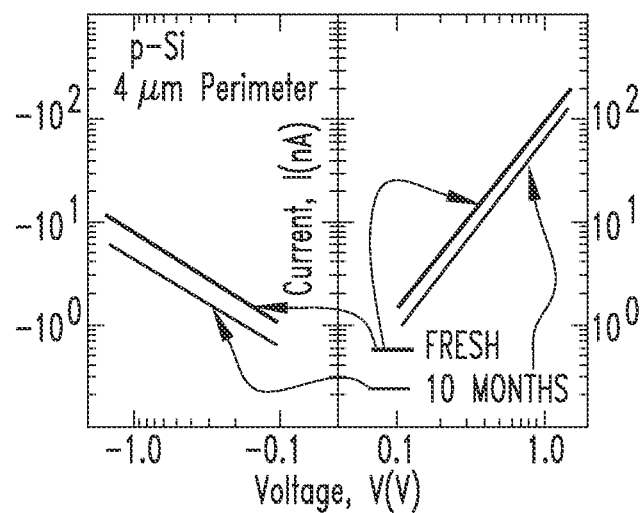
FIGS. 24-25 show terminal I-V characteristics of the device of FIG. 7.
Figure 25:
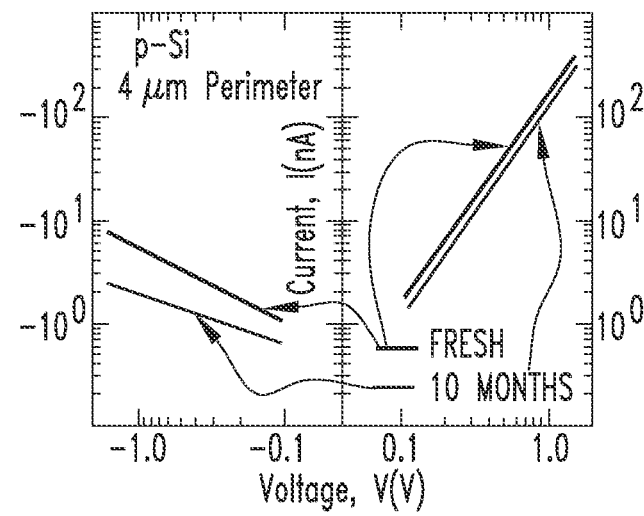

Native oxide forms on metals and Si surfaces in air, and it has been reported that oxide formation on cathode surfaces significantly reduces the emission current. In order to test the effect of native oxide formation, the I-V characteristics of the void-channel diode structure of FIG. 7 were measured after 10 months of time lapse (in ambient air) and the result was compared with those measured right after fabrication (first measurement usually performed within 24 hours after FIB etching). The I-V characteristics of these two cases (for both a p-Si substrate sample and an n-Si substrate sample) are shown in FIGS. 24 and 25. The forward current of a p-Si substrate sample (cathode, Al) reveals a small decrease (23% at 1.5 V) after 10 months, whereas the n-Si substrate sample (cathode, n-Si) shows a slight increase (20% at 1.5 V) over the same period (See the figure below). Although the amount of change is relatively small, the different behavior of Al and Si cathodes may be associated with the beneficial role of oxide formation in passivating the surface states on Si.

In addition, the vertical void-channel structures tested did not show any instability problems, such as the one associated with a "forming process" in conventional cold cathodes. The endurance of the cathode emission process in the diode structures of FIG. 7 (both n-Si and p-Si substrate samples) was also tested by performing repeated scans (anode-cathode voltage of −1.5 to +1.5 V; scan time, 15 s. No measurable change in I-V characteristics was observed after 1200 scans (total 5 hours of continuous scanning).

Harboring a two-dimensional electronic system, graphene can be highly conductive in in-plane transport while being transmissive to impinging electrons. Based on these in- and out-of-plane interaction properties, a suspended graphene membrane is promising as an ideal gate (grid) to control electron transport in nanoscale vacuum electronic devices.

Figure 36A:
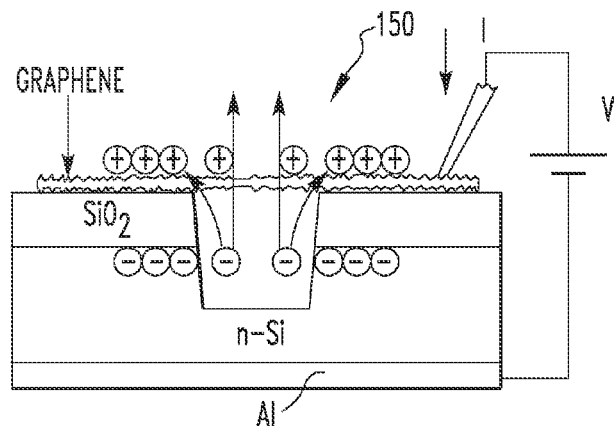
FIGS. 36A-36C demonstrate an electronic device according to a further alternative embodiment of the present invention.
Figure 36B:
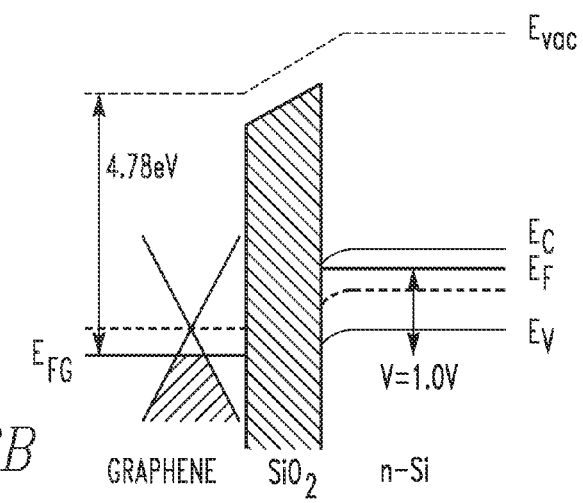

In one embodiment of the present invention, the potential to use graphene as an electron-permeable grid layer in low-voltage nanoscale vacuum electronic devices was explored. In particular, referring to FIGS. 36A-36C, an elecgtromnci device 150 was formed wherein a graphene membrane was placed on top of a nano-void channel (500 nm×500 nm cross-section; 1 µm depth) that was focused-ion-beam (FIB) etched into a SiO₂ (23 nm thickness)/n-Si (5 Ω-cm resistivity) substrate. A graphene % oxide (or air)/Si (GOS) structure, instead of MOS, was formed by introducing a monolayer graphene as a counter-electrode to the 2DEG layer at the SiO₂/Si interface. Here, in the two-terminal mode of operation, the graphene serves as an anode while the n-Si substrate serves as a cathode. Under forward bias (i.e., graphene electrode positively biased with respect to n-Si substrate), a quasi-2DEG (accumulation) develops in the Si side while a 2D hole system (2DHS) forms in the graphene side (FIG. 36B). Due to the Coulombic repulsion of electrons around the aperture edge, the 2DEG in Si emits into air and travels up toward the edge of 2DHS at graphene/SiO₂ interface (FIG. 36A).

Figure 36C:
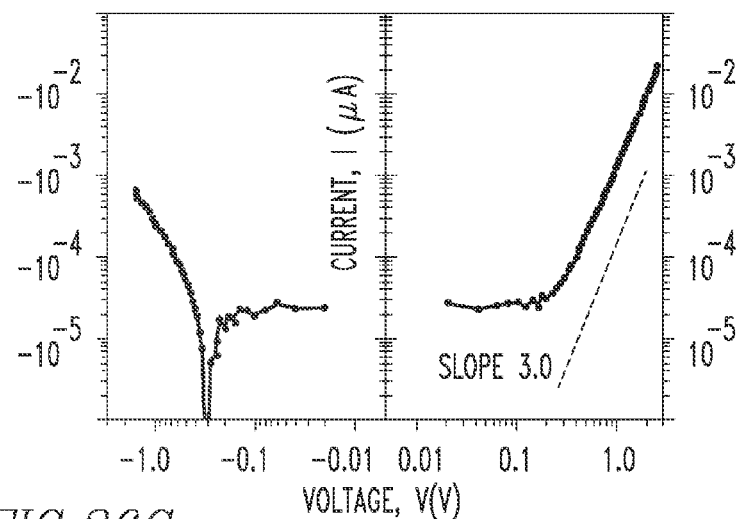

FIG. 36C shows a measurement result of the channel-current-versus-voltage (I-V) characteristic. The forward I-V characteristic reveals the 1 V dependence for V>0.4 V. Note that the flat band voltage of this GOS structure is 0.38 V, and accumulation electrons begin to develop at around this voltage. At 1 V bias, the channel current is measured to be 1.3 nA. The $V^3$ regime is called the double injection or injected plasma regime (13). This corresponds to another type of space-charge-limited emission, differing from the Child-Langmuir's $V^{1.5}$ dependence or the Mott-Gurney's $V^{2.0}$ (14-17): the $V^3$ regime involves bipolar space charges (electrons and holes) injected into a void channel, whereas the latter ones are mostly governed by unipolar space charges (electrons).

Presence of a free-standing graphene layer in a nano-void channel, and therefore the availability of a 2D hole system in the aperture region, is found to affect the space charge field in the channel. In response to electron injection from the cathode, for example, the graphene anode brings positive space charges into the void channel by inducing a 2D hole system in the free-standing cover. This has the effect of neutralizing electron space charges. With a reduced space charge field on cathode surface, electron emission becomes easier, resulting in higher channel current with stronger voltage dependence (i.e., $V^3$ instead of $V^{1.5}$ or $V^{2.0}$).

In order to elucidate the role played by a suspended graphene on 2DEG emission, an additional sample structure was prepared and characterized. Without involving graphene, a Ga droplet was directly placed on top of a nano-void-channel-etched SiO₂/n-Si substrate, and the resulting I-V characteristic was compared with that of the sample with graphene/Ga. Here the Ga droplet size was designed to be significantly greater than the channel diameter (500 µm versus 500 nm) so that incident electrons are fully captured. The forward I-V characteristic reveals the $V^2$ dependence for V>0.1 V. Similar to Child-Langmuir's $V^{1.5}$ regime, the space charge effect on limiting cathode emission (therefore, channel current) is relatively strong compared to that of the $V^3$ regime of the sample with graphene. At low bias (V<0.8 V), the sample with Ga-only showed larger current than the sample with graphene/Ga. This is explained by the fact that the work function of Ga (4.3 eV) is smaller than that of the graphene under Ga (estimated to be 4.5 eV) (19), and therefore accumulation electrons build up more readily at low voltage for the Ga-only sample case. At 0.3 V, for example, the 2DEG density is calculated to be 2.0×10¹¹ cm⁻² or 4.0× 10¹⁰ cm⁻² for the Ga-only or the graphene/Ga sample, respectively. The ratio of the two electron densities well corresponds to the ratio of channel currents at the same bias (80 nA versus 17 nA). As bias voltage is increased over the flat band voltage, accumulation electrons build up fast, ensuing electron emission at cathode and space charge build-up in the void channel. In the graphene/Ga sample case, hole space charges are induced in the suspended graphene area and the double injection regime emerges, as evidenced by a steep rise of channel current at V>0.2 V. It is noted that the $V^3$ regime of the graphene/Ga sample surpassed the $V^2$ regime current of the Ga-only sample at 0.8 V. This comparison confirms that in low bias the graphene's work function sensitively affects 2DEG density and channel current, whereas in large bias, the graphene's ability to mitigate the effect of space-charge-fields' limiting the cathode emission plays a more critical role in determining the channel current. Overall, it is discovered that presence of suspended graphene significantly enhances electron emission at cathode beyond the level of Child-Langmuir's space-charge-limited emission.

Figure 26:
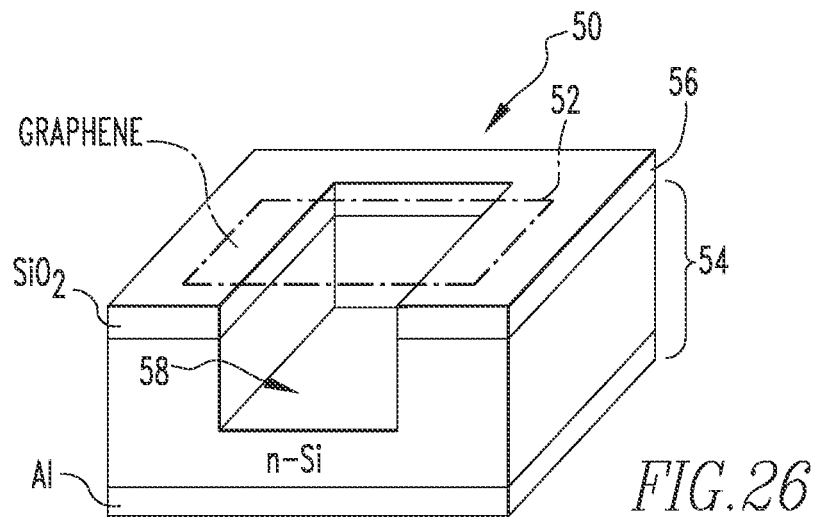
FIG. 26 is a schematic diagram of a photodetector according to a further embodiment of the present invention.
Figure 27:
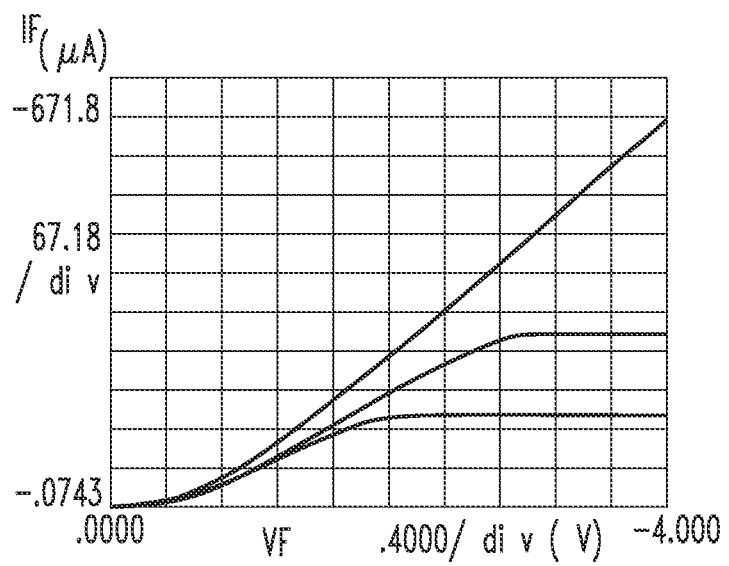
FIG. 27 shows a measurement result obtained with a white light source at three different intensity levels being directed at the photodetector of FIG. 26.

The 2DES-enabled low-voltage electron emission as described herein can be further utilized in photodetection. FIG. 26 shows a schematic of a photodetector 50 formed on n-Si substrate with a transparent (i.e., permitting passage of light rays herethrough) electrode (e.g., graphene monolayer) placed on a trench structure. More specifically, in the illustrated embodiment, photodetector 50 includes a transparent first conducting layer 52 made of a transparent conductive material (graphene in the illustrated embodiment), a second conducting layer 54 made of conducive material (n-Si substrate on Al in the illustrated embodiment), and a" insulating layer 56 made of an insulating material ($SiO_2$ in the illustrated embodiment) provided between transparent first conducting layer 52 and second conducting layer 54. A void channel 58 is provided in photodetector 50 that extends from a top surface of insulating layer 56 and partially into n-Si substrate of second conducting layer 54. As is well known in the art, graphene is a substance composed of pure carbon, with atoms arranged in a regular hexagonal pattern similar to graphite, but in a one-atom thick sheet. Under a reverse bias [top, graphene (−) and bottom, Al (+)], the dark current remains low. Under optical illumination, the incident light is absorbed by Si and the photocarriers generated near the oxide interface are separated, with holes forming an inversion layer at the Si/$SiO_2$ interface (interface of second conducting layer 54 and insulating layer 56) and electrons drifting away from the interface to bottom side. This photo-induced 2DHS at the Si/$SiO_2$ interface further induces a 2DES in the graphene layer (transparent first conducting layer 52). Electrons are emitted from the graphene layer (transparent first conducting layer 52) at the step edges defined by the sidewalls of void channel 58, mainly driven by Coulombic repulsion around the edges in the 2DES. The emitted electrons travel to bottom side and are captured at the edge of the 2DHS formed at the Si/SiO2 interface (interface of second conducting layer 54 and insulating layer 56). FIG. 27 shows a measurement result obtained with a white light source at three different intensity levels. The photocurrent initially increases as the reverse bias voltage is increased. Then the current level saturates for further increases of bias voltage. This initial increase is governed by Child-Langmuir's space-charge limited current. The saturation current level is mainly determined by photocarrier generation, therefore the illumination intensity.

Figure 28:
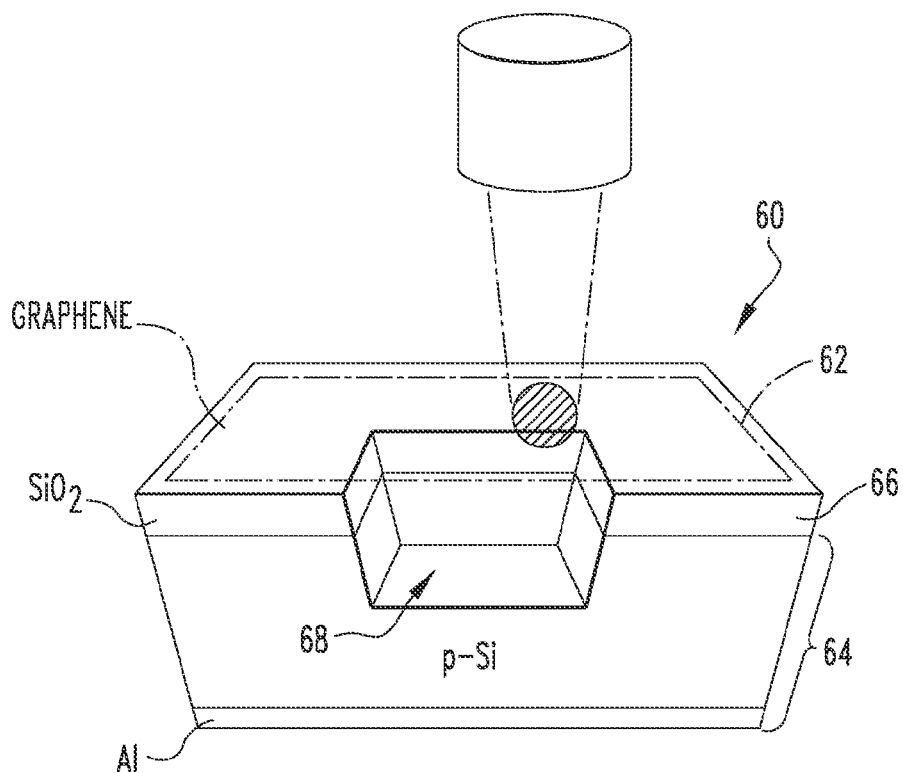
FIG. 28 is a schematic diagram of a photodetector according to another further embodiment of the present invention.
Figure 29:
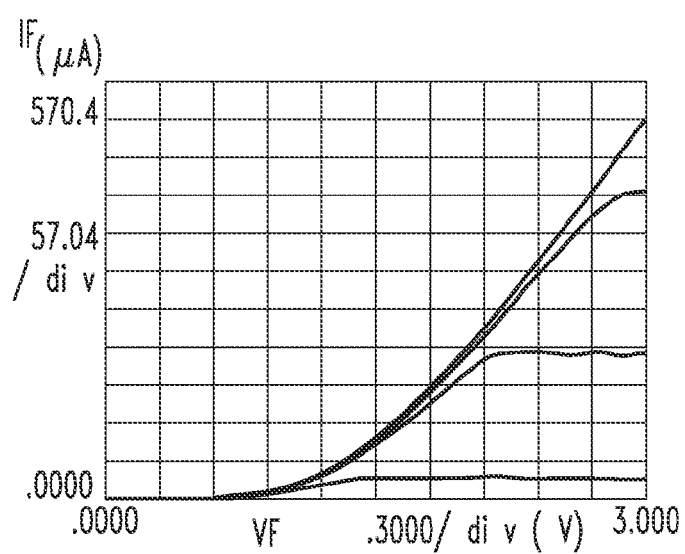
FIG. 29 shows a measurement result obtained with a white light source at different intensity levels being directed at the photodetector of FIG. 28.

FIG. 28 shows a photodetector 60 formed on p-Si substrate. More specifically, in the illustrated embodiment, photodetector 60 includes a transparent first conducting layer 62 made of a transparent conductive material (graphene in the illustrated embodiment), a second conducting layer 64 made of conductive material (n-Si substrate on Al in the illustrated embodiment), and an insulating layer 66 made of an insulating material ($SiO_2$ in the illustrated embodiment) provided between transparent first conducting layer 62 and second conducting layer 64. A void channel 68 is provided in photodetector 60 that extends from a top surface of insulating layer 66 and partially into p-Si substrate of second conducting layer 64. Under a reverse bias [top, graphene (+) and bottom, Al (−)], the photocarriers generated near the oxide interface are separated such that electrons form an inversion layer at the Si/SiO2 interface (interface of second conducting layer 64 and insulating layer 66) and holes drift away to the bottom side. This photo-induced 2DES further induces 2DHS in the graphene electrode (transparent first conducting layer 62). The 2DES on the Si side emits electrons at the edge, and the emitted electrons travel in the void channel 68 and are captured at the edges of 2DHS defined by the sidewalls of void channel 68. The saturation level of photocurrent is proportional to the illumination intensity. FIG. 29 shows a measurement result obtained with a white light source at a number of different intensity levels. A monolayer graphene may not capture all incoming electrons, and the capture efficiency, therefore the observed photocurrent can be increased further by employing thicker graphene or a transparent conducting oxide layer (e.g., ITO or TCO) as top electrode through which illumination is made.

Photocarrier multiplication, the process of generating two or more electron-hole pairs from a single absorbed photon, can occur in semiconductor quantum dots or nanocrystals. Translating this carrier-level performance into a device-level improvement in sensing or converting photon energy, however, remains challenging. In one embodiment, the present invention provides a graphene/SiO2/Si photodetector with a nanoscale void channel that demonstrates internal quantum efficiency of 115-175% as measured with photocurrent in the UV-Vis range.

Photocarriers generated in Si are separated by the depletion field developed in the region under the reverse-biased graphene electrode: minority carriers drift to the oxide interface forming an inversion layer of quasi-2D electronic system (2DES), while majority carriers are driven away to the substrate inducing a current flow around the external circuitry. The 2D electron gas (2DEG) at SiO2/Si constantly emit into the nano-void channel, enabling continuous separation of photogenerated carriers. The loss of photoelectrons into air results in accumulation of holes in Si, which in turn induces a strong build-up of photoelectron 2DEG at SiO2/Si reaching the $10^{13}$ cm$^{-2}$ level. The electric field in the inversion layer rises above $10^6$ V/cm, allowing the carriers there to gain a significant amount of kinetic energy (~0.3 eV) within a mean-free scattering length (~10 nm). A step-like increase of photocurrent and quantum efficiency is observed for incident wavelength of ~650 nm or smaller, indicating that carrier multiplication by impact excitation occurs for an excess energy of 1.1 eV or greater. The photocarrier multiplication by self-induced electric field in the 2DES of a graphene/oxide/Si structure enables solar energy conversion with quantum efficiency exceeding 100%.

Figure 30A:
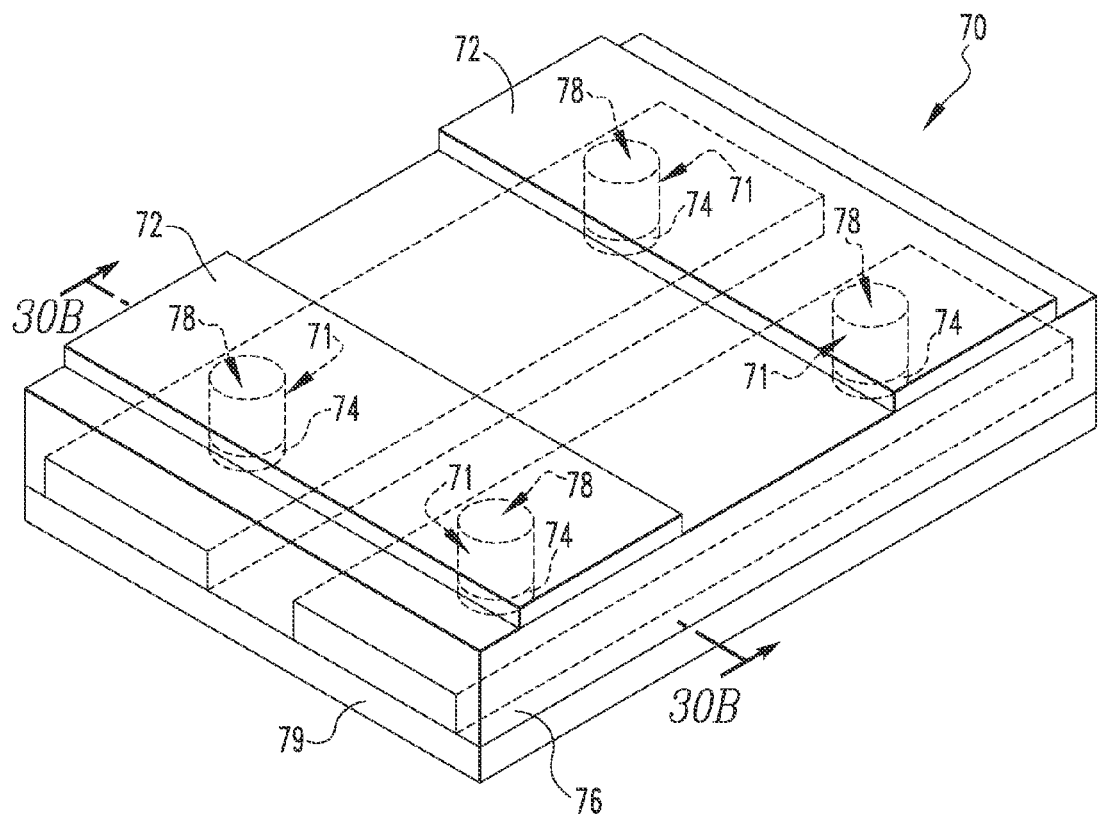
FIG. 30A is a schematic illustration and FIG. 30B is a cross-sectional diagram (taken along lines B-B of FIG. 30A) of a 2D image sensor array according to another further embodiment of the present invention.
Figure 30B:
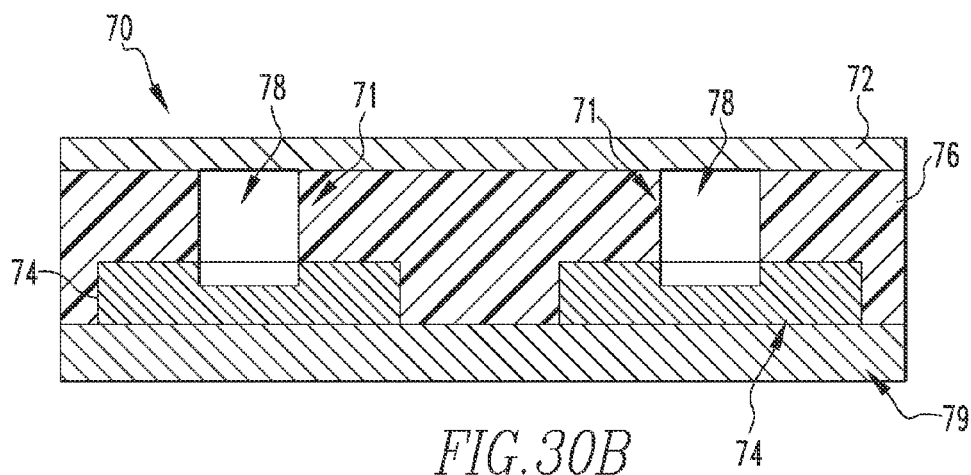

The 2DES-enabled photodetection as described above can be further utilized as image sensors and arrays (1D or 2D). FIG. 30A is a a schematic illustration and FIG. 30B is a cross-sectional diagram (taken along lines B-B of FIG. 30A) of a 2D image sensor array 70 based on the edge emission structure described above that employs a number of void channel or trench structure photodetectors 71 (each similar in form to photodetectors 50 and 60 discussed above). As shown in FIGS. 30A and 30B, each void channel or trench structure photodetector 71 includes a transparent first conducting layer 72 made of a transparent conductive material, a second conducting layer 74 (provided on an insulating substrate 79) made of conductive material, and an insulating layer 76 made of an insulating material provided between transparent first conducting layer 72 and second conducting layer 74. A void channel 78 is provided in photodetector 71 that extends from a top surface of insulating layer 76 and partially into second conducting layer 74. Each void channel or trench structure photodetector 71 defines a pixel, and the light intensity registered at each pixel is read out by employing a cross-bar-type electrode configuration. Selecting proper row and column lines for cathode and anode, each individual pixel is addressed and the optical intensity information at each pixel is read out.

Figure 31A:
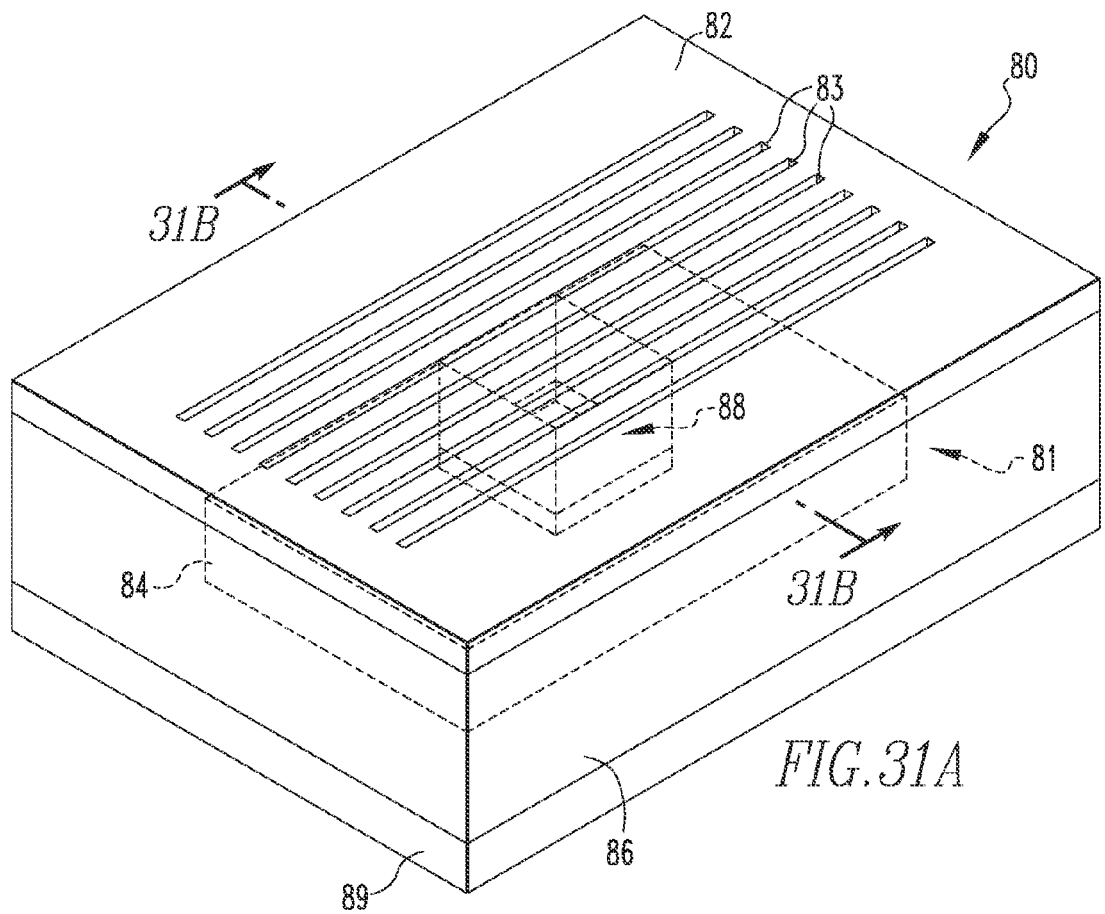
FIG. 31A is a schematic illustration and FIG. 31B is a cross-sectional diagram (taken along lines B-B of FIG. 31A) of an image sensor according to another further embodiment of the present invention.
Figure 31B:
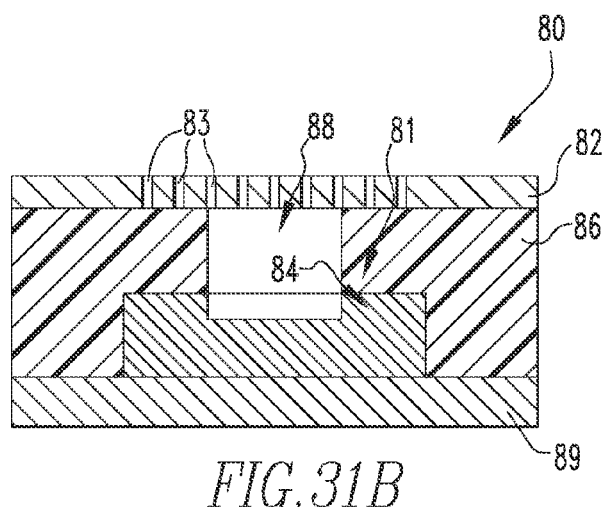

The image sensor array described above can be further developed into a spectral sensing (color sensing) array. FIG. 31A is a schematic illustration and FIG. 31B is a cross-sectional diagram (taken along lines B-B of FIG. 31A) of an image sensor 80 that incorporates a plasmonic metal nanostructure for the top electrode. More specifically, image sensor 80 employs a void channel or trench structure photodetector 81 (similar in form to photodetectors 50 and 60 discussed above). As shown in FIGS. 31A and 31B, photodetector 81 includes a light transmitting first conducting layer 82 comprising a conductive material having an array of slits or apertures provided therein. Photodetector 81 further includes a second conducting layer 84 (provided on an insulating substrate 89) made of conductive material, and an insulating layer 86 made of an insulating material provided between first conducting layer 82 and second conducting layer 84. A void channel 88 is provided in photodetector 82 that extends from a top surface of insulating layer 86 and partially into second conducting layer 84. The top electrode (first conducting layer 82) is designed to perform as an optical bandpass filter array in selectively transmitting incident light into second conducting layer 84 (e.g., an Si substrate), while serving as an anode in capturing the photocarriers emitted from cathode layer (second conducting layer 84). The top metal electrode pattern (slit/aperture period, width, metal thickness) is designed such that the localized surface plasmon resonance occurs at the passband wavelength allowing spectral filtering of incident light. Alternatively, each pixel area (each photodetector 81) can be covered with thin film color filters (e.g., R, G, B, C filters for color imaging).

The 2DES-enabled photodetection as described above can be further utilized in solar cells without pn-junctions. FIG. 32A is a schematic illustration and FIG. 32B is a cross-sectional diagram (taken along lines B-B of FIG. 32A) of a photovoltaic cell 90 that employs a number of void channel or trench structure photodetectors 91 (each similar in form to photodetectors 50 and 60 discussed above). As shown in FIGS. 32A and 32B, each photodetector 91 includes a transparent first conducting layer 92 made of a transparent conductive material (e.g., indium tin oxide (ITO) or another transparent conductive oxide (TCO) or graphene), a light absorbing second conducting layer 94 (provided on a metal Ohmic contact layer 99) made of a light absorbing conductive material (e.g., n-Si or p-Si), and an insulating layer 76 made of an insulating material (e.g., $SiO_2$) provided between transparent first conducting layer 92 and second conducting layer 94. A void channel 98 is provided in each photodetector 91 that extends from a top surface of insulating layer 96 and partially into second conducting layer 94. The transparent electrode material and the bottom conducting material (light absorbing layer for photocarrier generation) are chosen such that the work function difference (basically flat band voltage) will be maximized in order to enable significant band bending (therefore a strong built-in field) at the oxide/semiconductor interface at zero bias. For incident light, the generated photocarriers are separated by the built-in electric field developed near the oxide/semiconductor interface. Electrons are emitted from the edges of the 2DES in the cathode (first conducting layer 92) and holes drift to the other way. Electrons travel around the circuitry and recombine with holes at the bottom Ohmic contact layer 99, completing the cycle of photovoltaic conversion. This junctionless solar cell is expected to be less prone to surface recombination loss, since the active layer (semiconductor substrate) is passivated by an oxide (or nitride) layer, which is designed to serve as an insulating layer of an edge-emitting capacitor structure.

This junctionless solar cell structure/concept can be implemented for a bottom illumination configuration as well, particularly suitable for thin film solar cells. FIG. 33 is a cross-sectional diagram of a photovoltaic cell 100 that employs a number of void channel or trench structure photodetectors 101 according to an alternative (bottom illumination) embodiment. As shown in FIG. 33, each photodetector 101 includes a transparent first conducting layer 102 made of a transparent conductive material (e.g., indium tin oxide (ITO) or another transparent conductive oxide (TCO) or graphene) that is provided on a transparent substrate 103, a light absorbing second conducting layer 104 made of a light absorbing conductive material (e.g., n-Si or p-Si) that has a metal Ohmic contact layer 105 provided on a top side thereof, and an insulating layer 106 made of an insulating material (e.g. $SiO_2$) provided between transparent first conducting layer 102 and light absorbing second conducting layer 104. A void channel 108 is provided in each photodetector 101 that extends from a top surface of light absorbing second conducting layer 104 through insulating layer 106 and partially into transparent first conducting layer 102. In this embodiment, the top electrode (light absorbing second conducting layer 104) can then be thick metal, less prone to a contact/series resistance problem.

Figure 34A:
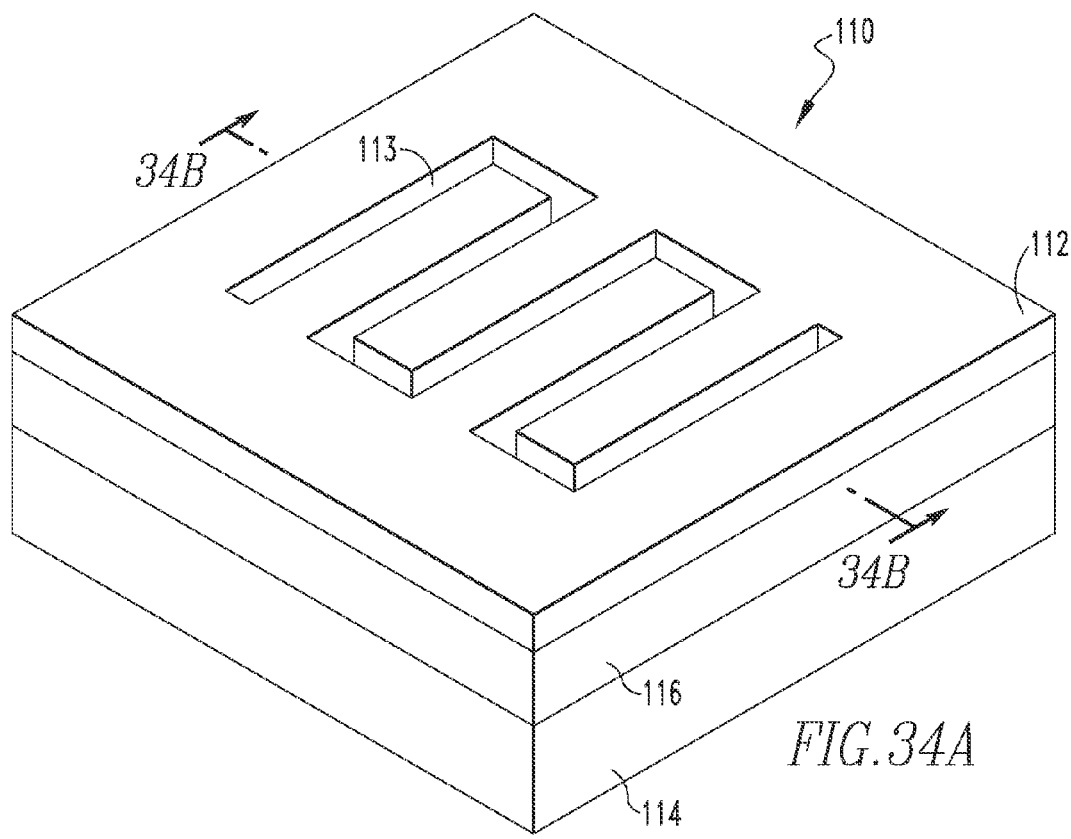
FIG. 34A is a schematic illustration and FIG. 34B is a cross-sectional diagram (taken along lines B-B of FIG. 34A) of an electron source according to another further embodiment of the present invention.
Figure 34B:
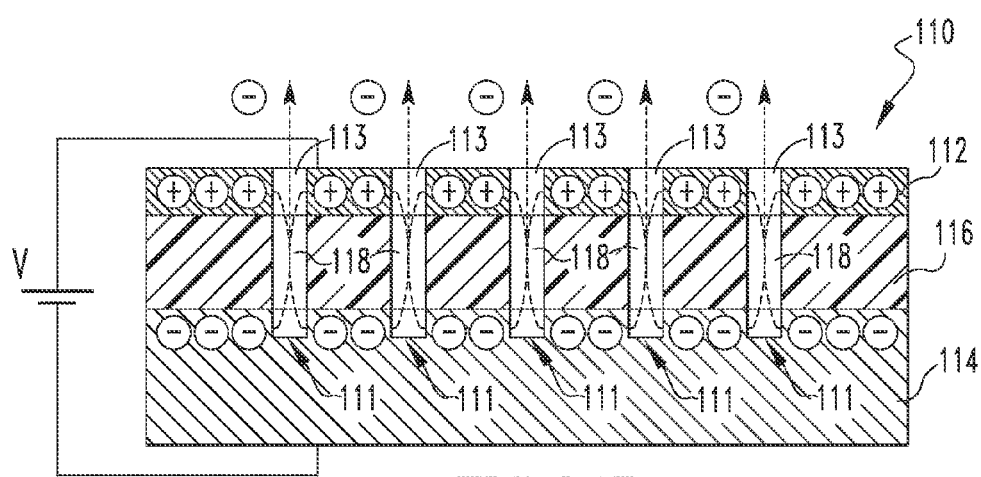

The 2DES-enabled edge emission structure can also be utilized as low-voltage, stable, electron source. FIG. 34A is a schematic illustration and FIG. 34B is a cross-sectional diagram (taken along lines B-B of FIG. 34A) of an electron source 110 according to an exemplary embodiment. Electron source 110 employs a number of electron emitter structures 111. As shown in FIGS. 34A and 34B, each electron emitter structure 111 includes a first conducting layer 112 comprising a conductive material having an aperture 113 provided therein, a second conducting layer 114 made of conductive material, and an insulating layer 116 made of an insulating material provided between first conducting layer 112 and second conducting layer 114. A void channel 118 is provided in electron emitter structure 111 that extends from aperture 113, through a insulating layer 116 and partially into second conducting layer 114. For maximum throughput, the top electrode (first conducting layer 112) is designed to be without a cover on the aperture area, and the aperture pattern is designed to maximize the edge length. In the exemplary, illustrated embodiment, electron source 110 includes an aperture 113 in the form of a hole array or an interdigitated aperture pattern.

Figure 35A:
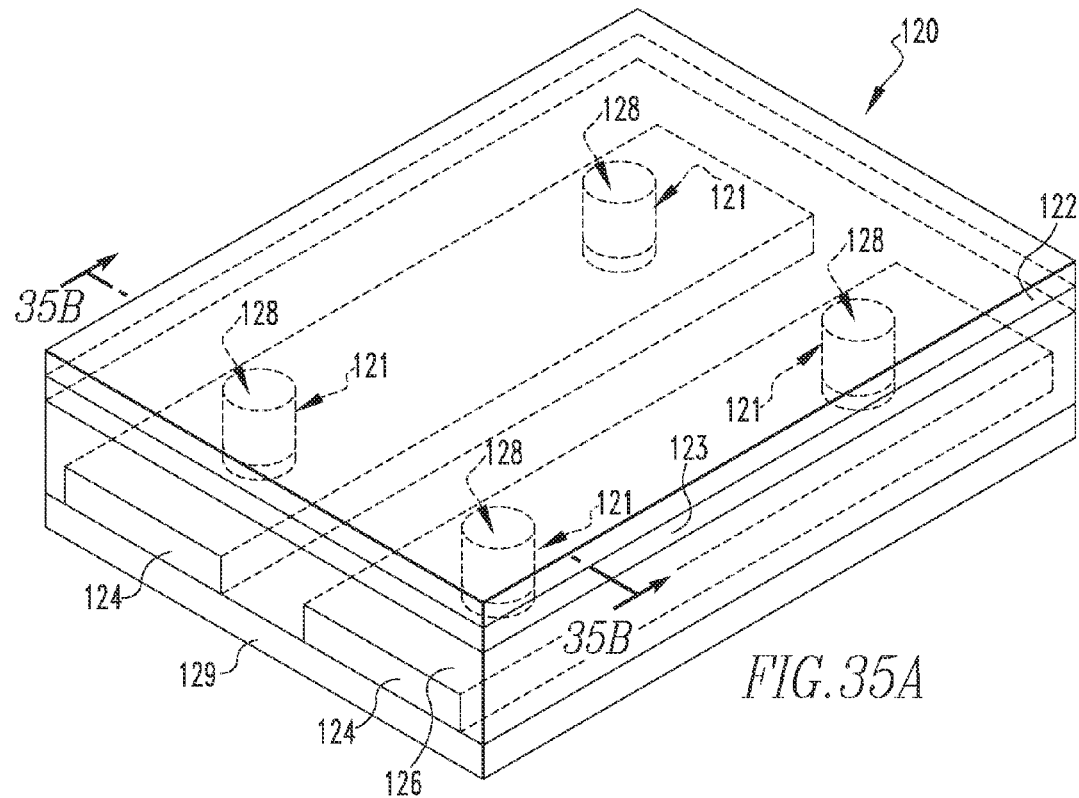
FIG. 35A is a schematic illustration and FIG. 35B is a cross-sectional diagram (taken along lines B-B of FIG. 35A) of a field emitter display array according to another further embodiment of the present invention.
Figure 35B:
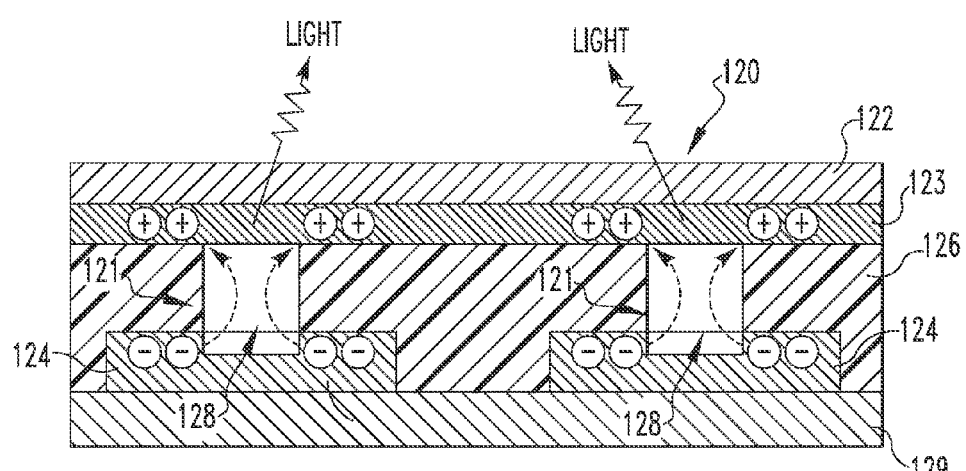

The 2DES-enabled electron source concept described above can be further designed into a field emission display. FIG. 35A is a schematic illustration and FIG. 35B is a cross-sectional diagram (taken along lines B-B of FIG. 35A) of a field emitter display array 120 that employs a number of light emitting structures 121. As shown in FIGS. 35A and 35B, each light emitting structure 121 includes a transparent first conducting layer 122 made of a transparent conductive material as described elsewhere herein, a phosphor layer 123 (or a layer of another material that can emit light under electron excitation) provided on a bottom surface of the transparent first conducting layer 122, a second conducting layer 124 (provided on an insulating substrate 129) made of conductive material, and an insulating layer 126 made of an insulating material provided between phosphor layer 123 and second conducting layer 124. A void channel 128 is provided in light emitting structure 121 that extends from a top surface of insulating layer 126 and partially into second conducting layer 124.

In the claims, any reference signs placed between parentheses shall not be construed as limiting the claim. The word "comprising" or "including" does not exclude the presence of elements or steps other than those listed in a claim. In a device claim enumerating several means, several of these means may be embodied by one and the same item of hardware. The word "a" or "an" preceding an element does not exclude the presence of a plurality of such elements. In any device claim enumerating several means, several of these means may be embodied by one and the same item of hardware. The mere fact that certain elements are recited in mutually different dependent claims does not indicate that these elements cannot be used in combination.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. An electronic device, comprising:
   a first conducting layer;
   a second conducting layer; and
   an insulating layer provided between the first conducting layer and the second conducting layer;
   wherein the electronic device includes at least one side wall that extends from the first conducting layer to the second conducting layer and that includes at least a portion of each of the first conducting layer, the second conducting layer and the insulating layer, wherein the electronic device is structured such that responsive to a bias voltage being applied between the first conducting layer and the second conducting layer, a two dimensional electron system is induced in at least one of the first conducting layer and the second conducting layer, and such that electrons from the two dimensional electron system are emitted from the at least one side wall side wall as a result of Coulombic repulsion and travel in air from the one of the first conducting layer and the second conducting layer to the other of the first conducting layer and the second conducting layer, wherein the first and second conducting layers are made of conductive materials that can provide mobile charge carriers (electrons or holes) and may include metal, semiconductor, oxide semiconductor, graphene and graphite material, and the insulating layer is made of an insulating material and may include air/vacuum and dielectric material such as oxide, nitride, wide bandgap semiconductor material, and wherein the conductive material is n-type silicon semiconductor, wherein responsive to the bias voltage the two dimensional electron system is induced in the second conducting layer, and wherein the electrons emitted from the at least one side wall travel in air from the second conducting layer to the first conducting layer.

2. The electronic device according to claim 1, wherein the second conducting layer includes a semiconductor substrate comprising the semiconductor material coupled to a metal electrode.

3. The electronic device according to claim 2, wherein the metal material is Al.

4. An electronic device, comprising:
   a first conducting layer;
   a second conducting layer; and
   an insulating layer provided between the first conducting layer and the second conducting layer;
   wherein the electronic device includes at least one side wall that extends from the first conducting layer to the second conducting layer and that includes at least a portion of each of the first conducting layer, the second conducting layer and the insulating layer, wherein the electronic device is structured such that responsive to a bias voltage being applied between the first conducting layer and the second conducting layer, a two dimensional electron system is induced in at least one of the first conducting layer and the second conducting layer, and such that electrons from the two dimensional electron system are emitted from the at least one side wall side wall as a result of Coulombic repulsion and travel in air from the one of the first conducting layer and the second conducting layer to the other of the first conducting layer and the second conducting layer, wherein the first and second conducting layers are made of conductive materials that can provide mobile charge carriers (electrons or holes) and may include metal, semiconductor, oxide semiconductor, graphene and graphite material, and the insulating layer is made of an insulating material and may include air/vacuum and dielectric material such as oxide, nitride, wide bandgap semiconductor material, and wherein the conductive material is p-type silicon semiconductor, wherein responsive to the bias voltage the two dimensional electron system is induced in the first conducting layer, and wherein the electrons emitted from the at least one side wall travel in air from the first conducting layer to the second conducting layer.

5. An electronic device, comprising:
   a first conducting layer;
   a second conducting layer; and
   an insulating layer provided between the first conducting layer and the second conducting layer;
   wherein the electronic device includes at least one side wall that extends from the first conducting layer to the second conducting layer and that includes at least a portion of each of the first conducting layer, the second conducting layer and the insulating layer, wherein the electronic device is structured such that responsive to a bias voltage being applied between the first conducting layer and the second conducting layer, a two dimensional electron system is induced in at least one of the first conducting layer and the second conducting layer, and such that electrons from the two dimensional electron system are emitted from the at least one side wall side wall as a result of Coulombic repulsion and travel in air from the one of the first conducting layer and the second conducting layer to the other of the first conducting layer and the second conducting layer, and wherein a thickness of the insulating layer is on the same order as or less than a mean free path of electrons in air (~60 nm).

6. The electronic device according to claim 5, wherein the first and second conducting layers are made of conductive materials that can provide mobile charge carriers (electrons or holes) and may include metal, semiconductor, oxide semiconductor, graphene and graphite material, and the insulating layer is made of an insulating material and may include air/vacuum and dielectric material such as oxide, nitride, wide bandgap semiconductor material.

7. The electronic device according to claim 6, wherein the insulating material is $SiO_2$.

8. The electronic device according to claim 5, wherein the at least one side wall comprises a cleaved edge that extends from a top surface of the first conducting layer to a bottom surface of the second conducting layer.

9. The electronic device according to claim 5, wherein the electronic device includes a void channel extending at least from the bottom surface of the first conducting layer through the insulating layer and to the top surface of the second conducting layer, wherein the at least one side wall is formed by the void channel.

10. The electronic device according to claim 9, wherein the void channel has a rectangular, slit, circular or oval cross-sectional shape.

11. The electronic device according to claim 9, wherein the sidewalls are on a mesa or pillar structure having a rectangular, slit, circular or oval cross-sectional.

12. The electronic device according to claim 5, wherein a two-dimensional electron system enabled low-voltage electron emission from the two dimensional electron system is utilized for photodetection, wherein the first conducting layer comprises a transparent electrode.

13. The electronic device according to claim 5, wherein a two-dimensional electron system enabled low-voltage electron emission from the two dimensional electron system is utilized for image sensing.

14. The electronic device according to claim 13, wherein the image sensing is combined with color sensing structures.

15. The electronic device according to claim 5, wherein a two-dimensional electron system enabled low-voltage electron emission from the two dimensional electron system is utilized for photovoltaic conversion without pn-junctions.

16. The electronic device according to claim 5, wherein a two-dimensional electron system enabled low voltage emission from the two dimensional electron system is utilized as a low-voltage, stable electron source.

17. The electronic device according to claim 16, wherein the stable low-voltage electron source is combined with a phosphor-coated transparent electrode for field emission display.

18. An electronic device, comprising:
a first conducting layer;
a second conducting layer; and
an insulating layer provided between the first conducting layer and the second conducting layer;
wherein the electronic device includes at least one side wall that extends from the first conducting layer to the second conducting layer and that includes at least a portion of each of the first conducting layer, the second conducting layer and the insulating layer, wherein the electronic device is structured such that responsive to a bias voltage being applied between the first conducting layer and the second conducting layer, a two dimensional electron system is induced in at least one of the first conducting layer and the second conducting layer, and such that electrons from the two dimensional electron system are emitted from the at least one side wall side wall as a result of Coulombic repulsion and travel in air from the one of the first conducting layer and the second conducting layer to the other of the first conducting layer and the second conducting layer, wherein the electronic device includes a void channel extending at least from the bottom surface of the first conducting layer through the insulating layer and to the top surface of the second conducting layer, wherein the at least one side wall is formed by the void channel, and wherein the electronic device is a field effect transistor, wherein the insulating layer is provided on a top surface of the second conducting layer, wherein the electronic device further includes a third conducting layer and a second insulating layer, the third conducting layer and the second insulating layer being located between a top surface of the insulating layer and a bottom surface of the first conducting layer, and wherein the void channel extends at least from the bottom surface of the first conducting layer through the second insulating layer, the third conducting layer, the first insulating layer to the top surface of the second conducting layer.

19. The electronic device according to claim 18, wherein the second conducting layer comprises a source of the field effect transistor, the first conducting layer comprises a drain of the field effect transistor, and the third conducting layer comprises a gate of the field effect transistor.

20. The electronic device according to claim 19, wherein the second conducting layer includes a semiconductor substrate coupled to a metal electrode.

21. The electronic device according to claim 19, wherein the semiconductor substrate is a p-Si substrate.

22. The electronic device according to claim 21, wherein the third conducting layer is made of indium-tin oxide.

23. The electronic device according to claim 19, wherein the first conducting layer has a first stripe shape having a first longitudinal axis, wherein the third conducting layer has a second stripe shape having a second longitudinal axis, and wherein the first longitudinal axis is perpendicular to the second longitudinal axis.

24. A method of operating an electronic device having a first conducting layer, a second conducting layer, an insulating layer provided between the first conducting layer and the second conducting layer, and at least one side wall that extends from the first conducting layer to the second conducting layer and that includes at least a portion of each of the first conducting layer, the second conducting layer and the insulating layer, the method comprising:
providing a bias voltage between the first conducting layer and the second conducting layer to induce a two dimensional electron system at least in one of the first conducting layer and the second conducting layer and thereby cause electrons from the two dimensional electron system to be emitted from the at least one side wall side wall as a result of Coulombic repulsion and travel in air from the one of the first conducting layer and the second conducting layer to the other of the first conducting layer and the second conducting layer, wherein a thickness of the insulating layer is on the same order as or less than a mean free path of electrons in air (~60 nm).

25. An electronic device, comprising:
a first conducting layer;
a second conducting layer; and
an insulating layer provided between the first conducting layer and the second conducting layer;
wherein the electronic device includes at least one side wall that extends from the first conducting layer to the second conducting layer and that includes at least a portion of each of the first conducting layer, the second conducting layer and the insulating layer, wherein the electronic device is structured such that responsive to a bias voltage being applied between the first conducting layer and the second conducting layer, a two dimensional electron system is induced in at least one of the first conducting layer and the second conducting layer, and such that electrons from the two dimensional electron system are emitted from the at least one side wall side wall as a result of Coulombic repulsion and travel in air from the one of the first conducting layer and the second conducting layer to the other of the first conducting layer and the second conducting layer, and wherein the first conducting layer comprises suspended graphene as an anode.

26. The electronic device according to claim 25, wherein impact ionization carrier multiplication is enabled by a self-induced electric field in the two dimensional electron system, and wherein internal quantum efficiency greater than 100% is achieved in solar energy conversion or photon detection.

\* \* \* \* \*